(12) United States Patent
Cho et al.

(10) Patent No.: US 11,842,790 B2
(45) Date of Patent: Dec. 12, 2023

(54) PAGE BUFFER CIRCUIT AND MEMORY DEVICE INCLUDING THE SAME

(71) Applicant: Samsung Electronics Co., Ltd., Suwon-si (KR)

(72) Inventors: Yongsung Cho, Suwon-si (KR); Inho Kang, Suwon-si (KR); Taehyo Kim, Suwon-si (KR); Jeunghwan Park, Suwon-si (KR); Jinwoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/125,260

(22) Filed: Mar. 23, 2023

(65) Prior Publication Data

US 2023/0223056 A1  Jul. 13, 2023

Related U.S. Application Data

(63) Continuation of application No. 17/207,398, filed on Mar. 19, 2021, now Pat. No. 11,646,064.

(30) Foreign Application Priority Data

Jul. 17, 2020 (KR) .................. 10-2020-0089163

(51) Int. Cl.
*G11C 7/10* (2006.01)
*G11C 7/12* (2006.01)

(52) U.S. Cl.
CPC .......... *G11C 7/1039* (2013.01); *G11C 7/1048* (2013.01); *G11C 7/1057* (2013.01); *G11C 7/1084* (2013.01); *G11C 7/12* (2013.01)

(58) Field of Classification Search
CPC .............................. G11C 7/1039; G11C 7/10
USPC ..................................................... 365/189.05
See application file for complete search history.

(56) References Cited

U.S. PATENT DOCUMENTS

| | | | |
|---|---|---|---|
| 7,061,813 B2 | 6/2006 | Lee | |
| 7,190,618 B2 | 3/2007 | Byeon | |
| 8,081,522 B2 | 12/2011 | Murakami | |
| 10,497,448 B2 | 12/2019 | Arakawa | |
| 10,720,207 B2 | 7/2020 | Cho et al. | |
| 2001/0050377 A1* | 12/2001 | Ikehashi | G11C 16/3468 257/200 |

(Continued)

FOREIGN PATENT DOCUMENTS

| KR | 1020060075401 A | 7/2006 |
|---|---|---|
| KR | 100898687 B1 | 5/2009 |

*Primary Examiner* — Muna A Techane
(74) *Attorney, Agent, or Firm* — Muir Patent Law, PLLC

(57) ABSTRACT

Provided are a page buffer and a memory device including the same. A memory device includes: a memory cell array including a plurality of memory cells; and a page buffer circuit including page buffer units in a first horizontal direction, the page buffer units being connected to the memory cells via bit lines, and cache latches in the first horizontal direction, the cache latches corresponding to the page buffer units, wherein each of the page buffer units includes one or more pass transistors connected to a sensing node of each of the plurality of page buffer units, the sensing node electrically connected to a corresponding bit line. Each sensing node included in each of the page buffer units and the combined sensing node are electrically connected to each other through the pass transistors.

20 Claims, 27 Drawing Sheets

(56) References Cited

U.S. PATENT DOCUMENTS

| | | | | |
|---|---|---|---|---|
| 2005/0105333 A1* | 5/2005 | Park | ............... | G11C 29/50 |
| | | | | 365/185.17 |
| 2007/0230253 A1* | 10/2007 | Kim | ............... | G11C 16/04 |
| | | | | 365/185.29 |

* cited by examiner

PAGE BUFFER CIRCUIT AND MEMORY DEVICE INCLUDING THE SAME

CROSS-REFERENCE TO RELATED APPLICATION

This application is a Continuation of U.S. patent application Ser. No. 17/207,398 filed on Mar. 19, 2021, now Allowed, which claims priority under 35 U.S.C. § 119 to Korean Patent Application No. 10-2020-0089163, filed on Jul. 17, 2020, in the Korean Intellectual Property Office, the disclosure of each of which is incorporated by reference herein in its entirety.

BACKGROUND

The inventive concept relates to a memory device, and more particularly, to a page buffer circuit and a memory device including the same.

Recently, in accordance with multi-functionality, high performance, and miniaturization of information communication devices, the large capacity and high integration of memory devices may be required. A memory device may include a page buffer circuit for storing data in or outputting data from memory cells, and the page buffer circuit may include semiconductor devices such as transistors. Due to demand for a reduction in a size of the page buffer circuit and development of process technology due to an increase in a degree of integration of the memory device, the size of device components included in the page buffer circuit may be reduced, and accordingly, a layout of wirings connected to the device components may become complicated.

SUMMARY

According to an aspect of the inventive concept, there is provided a memory device including: a memory cell array including a plurality of memory cells; and a page buffer circuit including a plurality of page buffer units in a first horizontal direction, the plurality of page buffer units being connected to the memory cells via a plurality of bit lines, and a plurality of cache latches corresponding to the plurality of page buffer units in the first horizontal direction, the plurality of cache latches are connected to a combined sensing node. The memory device is configured to, through the combined sensing node, transfer data from the plurality of cache latches to the plurality of page buffer units or from the plurality of page buffer units to the plurality of cache latches. Each of the plurality of page buffer units includes one or more pass transistors connected to a sensing node of each of the plurality of page buffer units, the sensing node electrically connected to a corresponding bit line. Each sensing node of each of the plurality of page buffer units and the combined sensing node are electrically connected to each other through the pass transistors.

In addition, according to another aspect of the inventive concept, there is provided a memory device including: a first semiconductor layer including a plurality of memory cells connected to each of a plurality of bit lines extending in a first horizontal direction; and a second semiconductor layer in a vertical direction to the first semiconductor layer and including a page buffer circuit, wherein the page buffer circuit includes: a main region including a plurality of page buffer units in the first horizontal direction; and a cache region adjacent to the main region in the first horizontal direction, the cache region including a plurality of cache latches in the first horizontal direction, the plurality of cache latches are connected to a combined sensing node, wherein each of the plurality of page buffer units includes a main latch and one or more pass transistors connected to a sensing node of each of the plurality of page buffer units, the sensing node electrically connected to a corresponding bit line, and wherein each sensing node included in each of the plurality of page buffer units and the combined sensing node are electrically connected to each other through the pass transistors such that the plurality of page buffer units are electrically connected to the plurality of cache latches.

In addition, according to another aspect of the inventive concept, there is provided a memory device including: a memory cell area including a plurality of memory cells and a first metal pad; and a periphery circuit area including a second metal pad, the periphery circuit area vertically connected to the memory cell area via the first metal pad and the second metal pad, wherein the periphery circuit area includes a page buffer circuit including a plurality of page buffer units in a first horizontal direction, the plurality of page buffer units being connected to the memory cells via a plurality of bit lines, and a plurality of cache latches in the first horizontal direction, the plurality of cache latches corresponding to each of the plurality of page buffer units and connected to a combined sensing node, wherein each of the plurality of page buffer units includes a pass transistor connected to each sensing node of each of the plurality of page buffer units, the sensing node electrically connected to a corresponding bit line, and wherein the sensing nodes included in each of the plurality of page buffer units and the combined sensing node are electrically connected to each other through the pass transistors included in the plurality of page buffer units.

In addition, according to another aspect of the inventive concept, there is provided a memory device including: a memory cell array including a plurality of first memory cells connected to each of a plurality of first bit lines extending in a first horizontal direction and a plurality of second memory cells connected to each of a plurality of second bit lines extending in the first horizontal direction; a page buffer circuit including a plurality of main regions in a second horizontal direction perpendicular to the first horizontal direction, and a plurality of cache regions in the second horizontal direction; and a page buffer decoder adjacent to the page buffer circuit in the first horizontal direction, the page buffer decoder configured to generate a decoder output signal corresponding to a fail bit number from the plurality of first and second memory cells, wherein the plurality of main regions include: a first main region including a plurality of first page buffer units in the first horizontal direction, each connected to the plurality of first memory cells via the plurality of first bit lines, each including one or more first pass transistors connected to a sensing node of each of the plurality of first page buffer units; and a second main region adjacent to the first main region in the second horizontal direction, the second main region including a plurality of second page buffer units in the first horizontal direction, each connected to the plurality of second memory cells via the plurality of second bit lines, each including one or more second pass transistors connected to a sensing node of each of the plurality of second page buffer units, wherein the plurality of cache regions include: a first cache region including a plurality of first cache latches in the first horizontal direction and corresponding to each of the plurality of first page buffer units, the plurality of first cache latches connected to a first combined sensing node; and a second cache region adjacent to the first main region in the second horizontal direction, the second cache region including a plurality of second cache latches in the first horizontal direction and corresponding to each of the plurality of second page buffer units, the plurality of second cache latches connected to a second combined sensing node, wherein each sensing node of each of the plurality of first page buffer units and the first combined sensing node are electrically connected to each other through the first pass transistors, and wherein each sensing node of each of the plurality of second page buffer units and the second combined sensing node are electrically connected to each other through the second pass transistors.

In addition, according to another aspect of the inventive concept, there is provided a page buffer circuit including: a plurality of page buffer units; and a plurality of cache latches commonly connected to the plurality of page buffer units via a combined sensing node, wherein each of the plurality of page buffer units includes a pair of pass transistors and a sensing node connected to the pair of pass transistors, and wherein each sensing node line included in each of the plurality of page buffer units and the combined sensing node are electrically connected to each other such that the plurality of page buffer units are electrically connected to the plurality of cache latches.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings.

Figure 1:
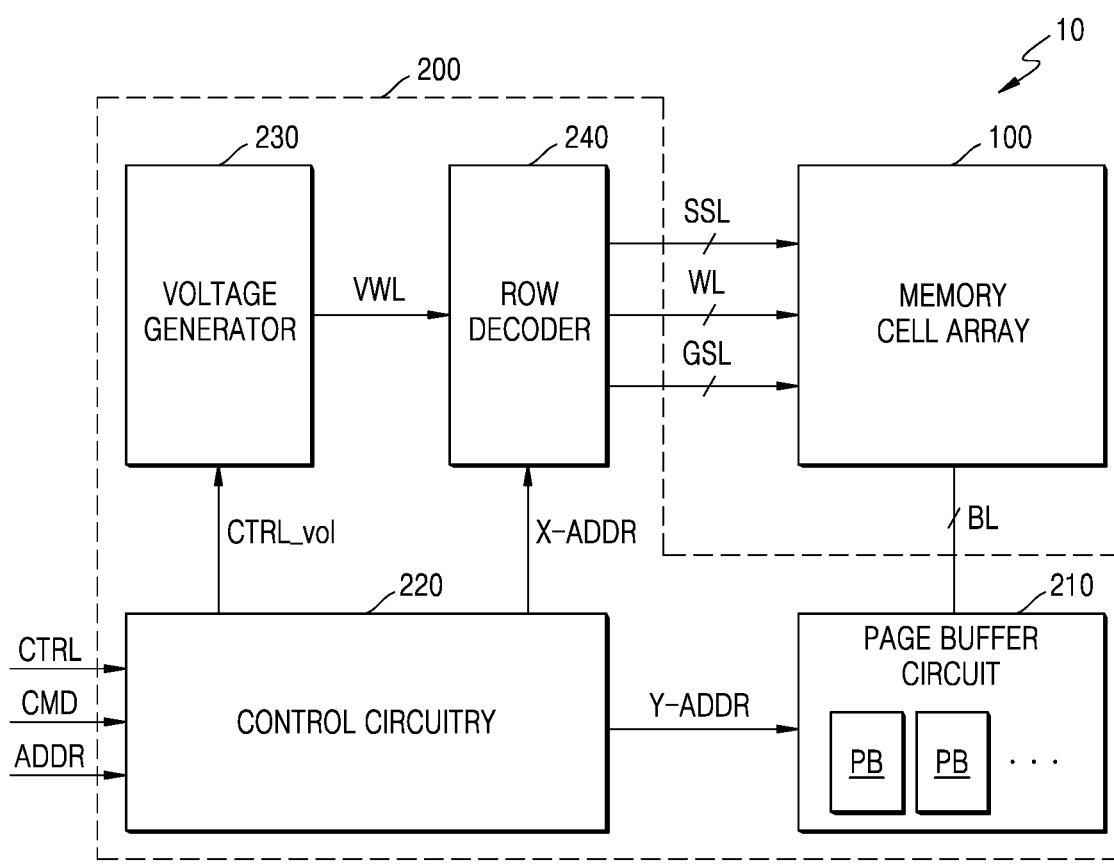
FIG. 1 is a block diagram of a memory device according to an embodiment of the inventive concept.

FIG. 1 is a block diagram of a memory device 10 according to an embodiment of the inventive concept. Referring to FIG. 1, the memory device 10 may include a memory cell array 100 and a periphery circuit 200, and the periphery circuit 200 may include a page buffer circuit 210, a control circuitry 220, a voltage generator 230, and a row decoder 240. Although not illustrated in FIG. 1, the periphery circuit 200 may further include a data input/output circuit, an input/output interface, etc. In addition, the periphery circuit 200 may further include a column logic, a pre-decoder, a temperature sensor, a command decoder, an address decoder, etc.

The memory cell array 100 may be connected to the page buffer circuit 210 via bit lines BL, and may be connected to the row decoder 240 via word lines WL, string select lines SSL, and ground select lines GSL. The memory cell array 100 may include a plurality of memory cells, and the plurality of memory cells may include, for example, flash memory cells. Below, embodiments of the inventive concept will be described for the case in which the plurality of memory cells include NAND flash memory cells. However, the invention is not limited thereto. In some embodiments, the plurality of memory cells may include resistive memory cells such as resistive random access memory (RRAM), phase-change RAM (PRAM), and magneto-resistive RAM (MRAM).

In an embodiment, the memory cell array 100 may include a three-dimensional (3D) memory cell array, the 3D memory cell array may include a plurality of NAND strings, and each NAND string may include memory cells respectively connected to the word lines WL vertically stacked on a substrate, as described in detail with reference to FIGS. 3 and 4. U.S. Pat. Nos. 7,679,133, 8,553,466, 8,654,587, 8,559,235, and U.S. Patent Application Publication No. 2011/0233648 disclose suitable configurations of a 3D memory array in which the 3D memory array is configured in a plurality of levels and word lines and/or bit lines are shared between levels, and are incorporated herein by reference. However, the invention is not limited thereto, and in some embodiments, the memory cell array 100 may include a two-dimensional (2D) memory cell array, and the 2D memory cell array may include a plurality of NAND strings arranged in row and column directions.

The control circuitry 220 may, based on a command CMD, an address ADDR, and a control signal CTRL, may program data in the memory cell array 100, read data from the memory cell array 100, or output various control signals for erasing data stored in the memory cell array 100, for example, a voltage control signal CTRL_vol, a row address X-ADDR, and a column address Y-ADDR. In this manner, the control circuitry 220 may control all of various operations in the memory device 10.

The voltage generator 230 may generate various kinds of voltages for performing program, read, and erase operations in the memory cell array 100 based on the voltage control signal CTRL_vol. The voltage generator 230 may generate a word line voltage VWL, for example, a program voltage, a read voltage, a pass voltage, an erase voltage, an erase verify voltage, or a program verify voltage. In addition, the voltage generator 230 may further generate a string select line voltage and a ground select line voltage based on the voltage control signal CTRL_vol.

The row decoder 240 may, in response to the row address X-ADDR, select one of memory blocks, select one of the word lines WL of the selected memory block, and select one of the plurality of string select lines SSL. The page buffer circuit 210 may select some of the bit lines BL in response to the column address Y-ADDR. The page buffer circuit 210 may operate as a write driver or a sense amplifier according to an operation mode.

The page buffer circuit 210 may include a plurality of page buffers PB respectively connected to a plurality of bit lines BL. In the present embodiment, page buffer units included in each of the plurality of page buffers PB (for example, first through $(n+1)^{th}$ page buffer units PBU0 through PBUn in FIG. 5) and cache latches included in each of the plurality of page buffers PB (for example, first through (n+1)th cache latches CL0 through CLn in FIG. 5) may be apart from each other, and have separate structures. Accordingly, the degree of freedom of wirings on the page buffer units may be improved, and the complexity of a layout may be reduced. In addition, because the cache latches are adjacent to data input/output lines, the distance between the cache latches and the data input/output lines may be reduced, and thus, data input/output speed may be improved. As used herein, a "unit" may refer to a "circuit".

Figure 9:
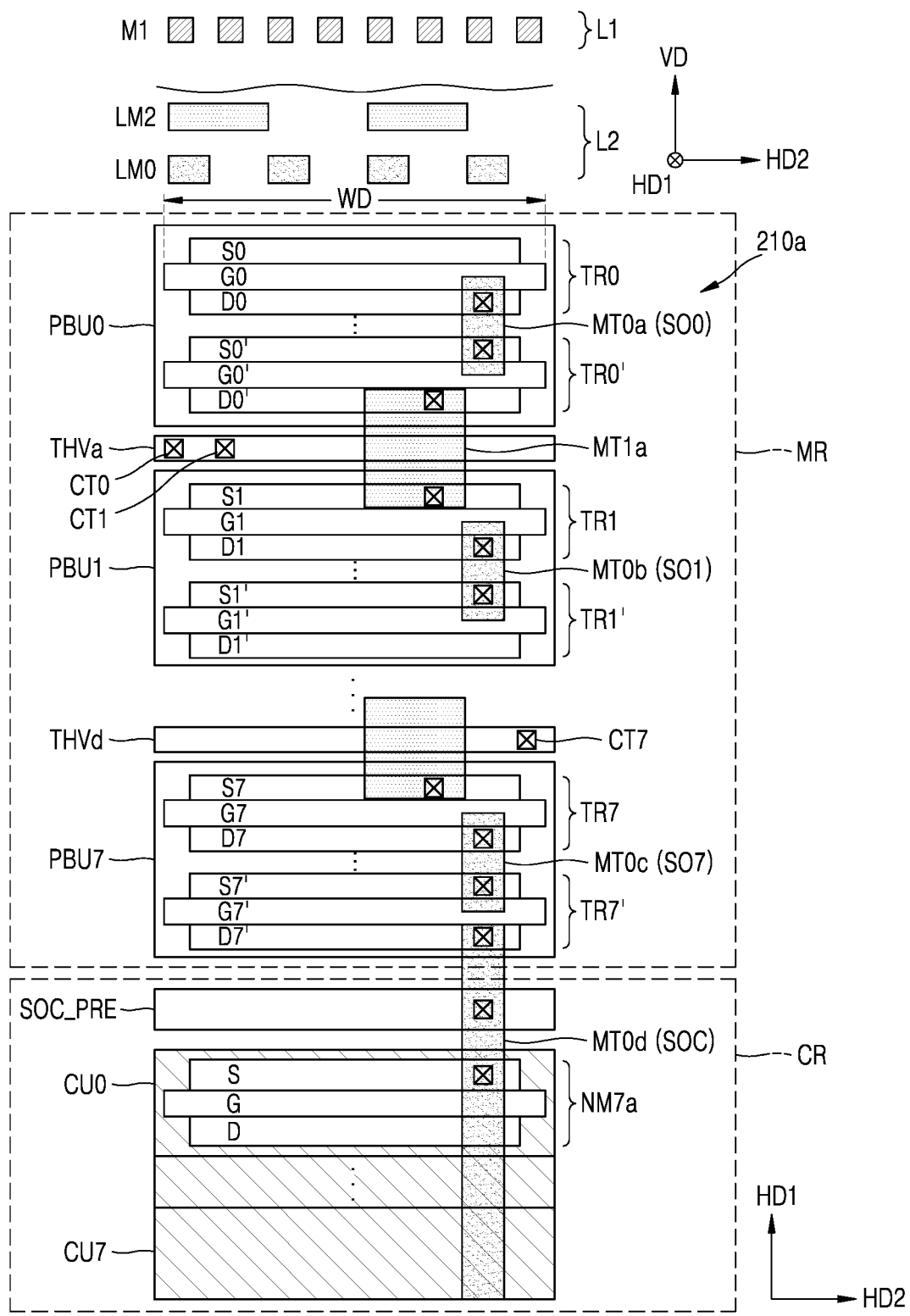
FIG. 9 is a plan view of a page buffer circuit according to an embodiment of the inventive concept.

In an embodiment, each page buffer unit may include a pair of pass transistors (for example, TR0 and TR0' in FIG. 9), and a sensing node line for connecting the pair of pass transistors to each other (for example, MT0a in FIG. 9). In this case, the sensing node line may be implemented as one track of a lower metal layer (for example, LM0 in FIG. 9), and may correspond to the sensing node. In a data sensing period, the pass transistors included in each of the plurality of page buffer units may not be electrically connected to each other, and accordingly, the sensing node lines included in each of the plurality of page buffer units may not be electrically connected to each other. On the other hand, in a data transfer period, the pass transistors included in each of the plurality of page buffer units may be connected to each other in series, and accordingly, the sensing node lines included in each of the plurality of page buffer units may be electrically connected to each other and be used as data transfer lines. Accordingly, because the page buffer circuit 210 does not need to separately include the plurality of data transfer lines for respectively connecting the plurality of page buffer units to the plurality of cache latches, an area of a region occupied by the page buffer circuit 210 may be reduced.

Figure 2:
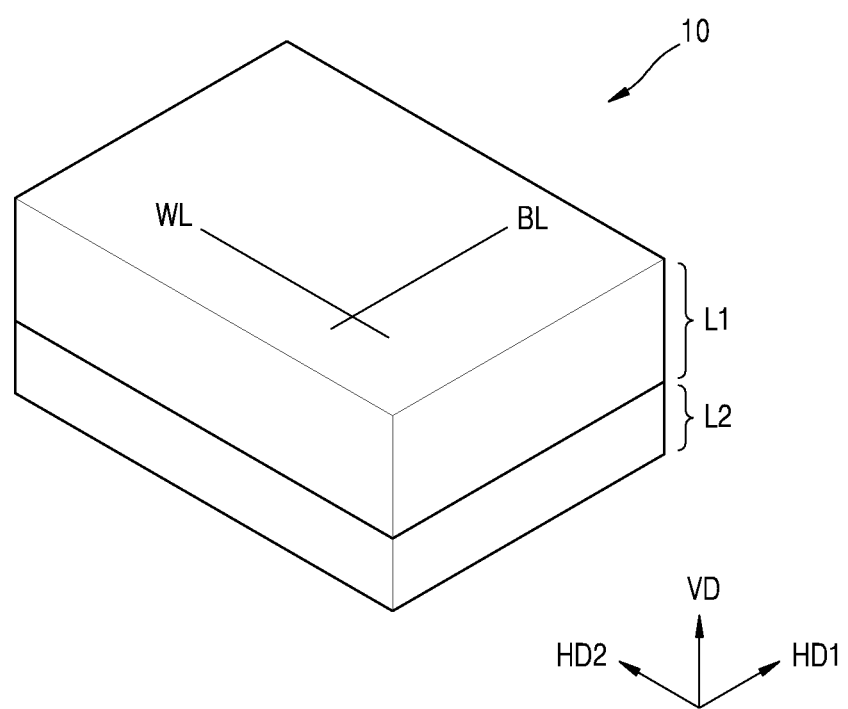
FIG. 2 schematically illustrates a structure of the memory device of FIG. 1, according to an embodiment of the inventive concept.

FIG. 2 schematically illustrates a structure of the memory device 10 of FIG. 1, according to an embodiment of the inventive concept. Referring to FIG. 2, the memory device 10 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to the substrate.

In an embodiment, the memory cell array 100 in FIG. 1 may be formed on the first semiconductor layer L1, and the periphery circuit 200 in FIG. 1 may be formed on the second semiconductor layer L2. Accordingly, the memory device 10 may have a structure in which the memory cell array 100 is on the periphery circuit 200, that is, a cell over periphery (COP) structure. The COP structure may effectively reduce an area in a horizontal direction and improve the degree of integration of the memory device 10.

In an embodiment, the second semiconductor layer L2 may include the substrate, and by forming transistors on the substrate and metal patterns for wiring transistors (for example, first and third lower metal layers LM0 and LM2 in FIG. 9), the periphery circuit 200 may be formed in the second semiconductor layer L2. After the periphery circuit 200 is formed on the second semiconductor layer L2, the first semiconductor layer L1 including the memory cell array 100 may be formed, and the metal patterns for connecting the word lines WL and the bit lines BL of the memory cell array 100 to the periphery circuit 200 formed in the second semiconductor layer L2 may be formed. For example, the bit lines BL may extend in a first horizontal direction HD1, and the word lines WL may extend in a second horizontal direction HD2.

As the number of stages of memory cells in the memory cell array 100 increases with the development of semiconductor processes, that is, as the number of stacked word lines WL increases, an area of the memory cell array 100 may decrease, and accordingly, an area of the periphery circuit 200 may also be reduced. According to the present embodiment, to reduce an area of a region occupied by the page buffer circuit 210, the page buffer circuit 210 may have a structure in which the page buffer unit and the cache latch are separated from each other, and may connect the sensing nodes included in each of the page buffer units commonly to a combined sensing node. This will be explained in detail with reference to FIG. 9.

Figure 3:
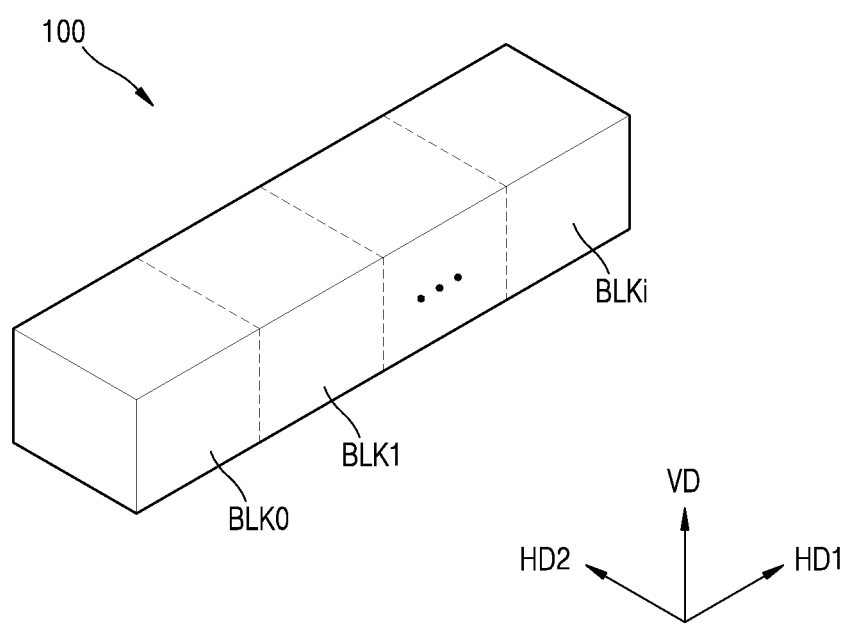
FIG. 3 schematically illustrates a memory cell array in FIG. 1, according to an embodiment of the inventive concept.

FIG. 3 schematically illustrates the memory cell array 100 in FIG. 1, according to an embodiment of the inventive concept. Referring to FIG. 3, the memory cell array 100 may include first through $(i+1)^{th}$ memory blocks BLK0 through BLKi, wherein i may be a positive integer. Each of the first through $(i+1)^{th}$ memory blocks BLK0 through BLKi may have a 3D structure (or a vertical structure). Each of the first through $(i+1)^{th}$ memory blocks BLK0 through BLKi may include a plurality of NAND strings extending in the vertical direction VD. In this case, the plurality of NAND strings may be provided apart from each other by a certain distance in the first and second horizontal directions HD1 and HD2. The first through $(i+1)^{th}$ memory blocks BLK0 through BLKi may be selected by the row decoder (240 in FIG. 1). For example, the row decoder 240 may select a memory block corresponding to a block address among the first through $(i+1)^{th}$ memory blocks BLK0 through BLKi.

Figure 4:
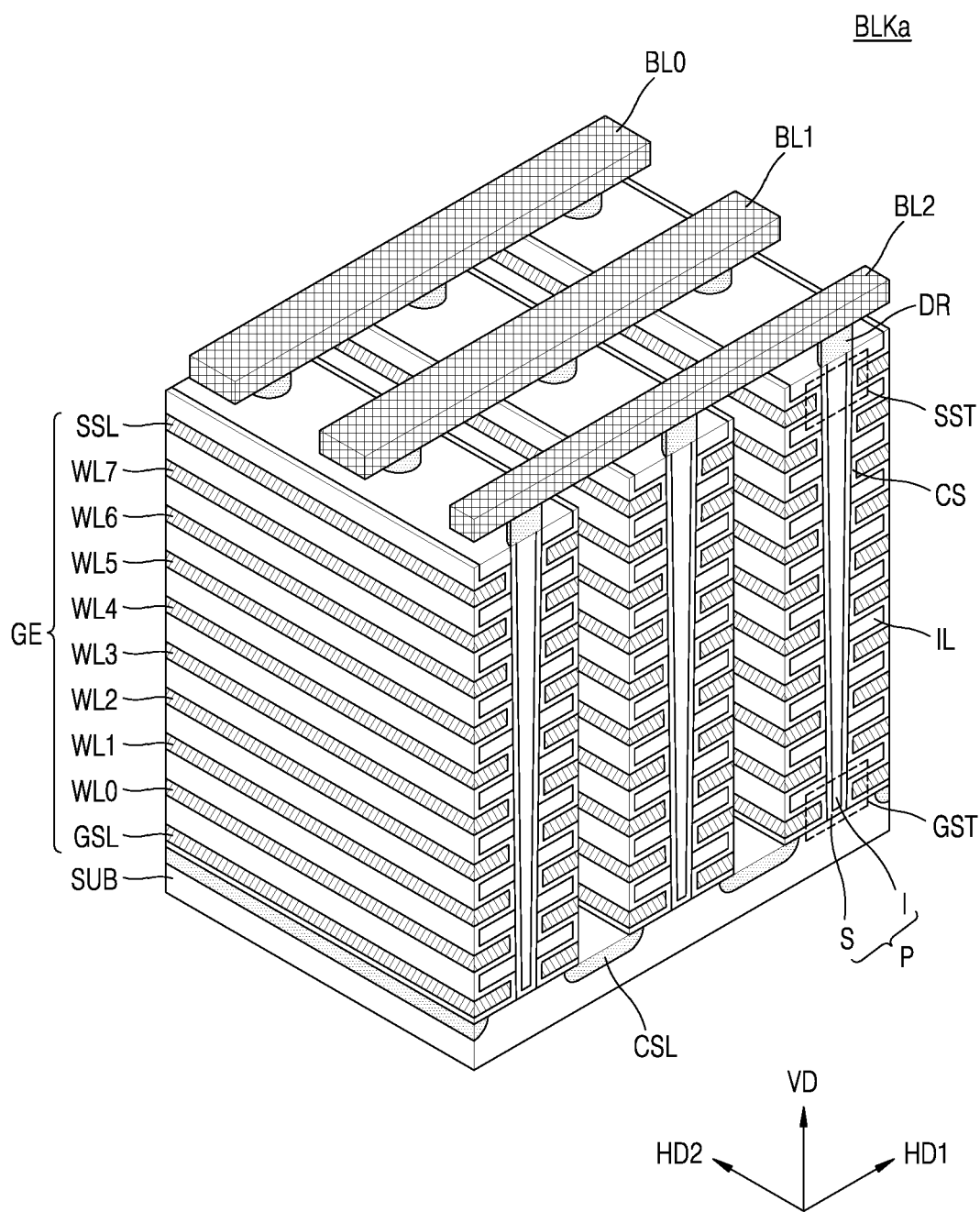
FIG. 4 is a perspective view of a memory block in FIG. 3 according to an embodiment of the inventive concept.

FIG. 4 is a perspective view of a memory block BLKa in FIG. 3 according to an embodiment of the inventive concept. Referring to FIG. 4, the memory block BLKa may be formed in a direction perpendicular to a substrate SUB. The substrate SUB may be of a first conductivity type (for example, a p-type), and a common source line CSL that extends on the substrate SUB in the second horizontal direction HD2 and is of a second conductivity type (for example, an n-type) may be provided. In a region between two adjacent common source lines CSL on the substrate SUB, a plurality of insulating layers IL, which extend in the second horizontal direction HD2, may be sequentially provided in the vertical direction VD, and the plurality of insulating layers IL may be apart from each other by a certain distance in the vertical direction VD. For example, the plurality of insulating layers IL may include an insulating material such as silicon oxide.

A plurality of pillars P may be provided sequentially in the first horizontal direction HD1, between two adjacent common source lines CSL in the region of the substrate SUB, and penetrate the plurality of insulating layers IL in the vertical direction VD. For example, the plurality of pillars P may contact the substrate SUB via the plurality of insulating layers IL. A surface layer S of each pillar P may include a silicon material of the first type, and may function as a channel region. An inner layer I of each pillar P may include an insulating material such as silicon oxide or an air gap.

In the region between two adjacent common source lines CSL, a charge storage layer CS may be provided along exposed surfaces of the insulating layers IL, the pillars P, and the substrate SUB. The charge storage layer CS may include a gate insulating layer (or, referred to as a tunneling insulating layer), a charge trap layer, and a blocking insulating layer. For example, the charge storage layer CS may have an oxide-nitride-oxide (ONO) structure. In addition, in the region between two adjacent common source lines CSL, a gate electrode GE including the select lines (for example, GSL and SSL) and first through eighth word lines WL0 through WL7 may be provided on an exposed surface of the charge storage layer CS.

Drains or drain contacts DR may be provided on each of the plurality of pillars P. For example, the drains or the drain contacts DR may include a silicon material doped with impurities of the second conductivity type. On the drains DR, first through third bit lines BL1 through BL3 extending in the first horizontal direction HD1 and being apart from each other by a certain distance in the second horizontal direction HD2 may be provided.

Figure 5:
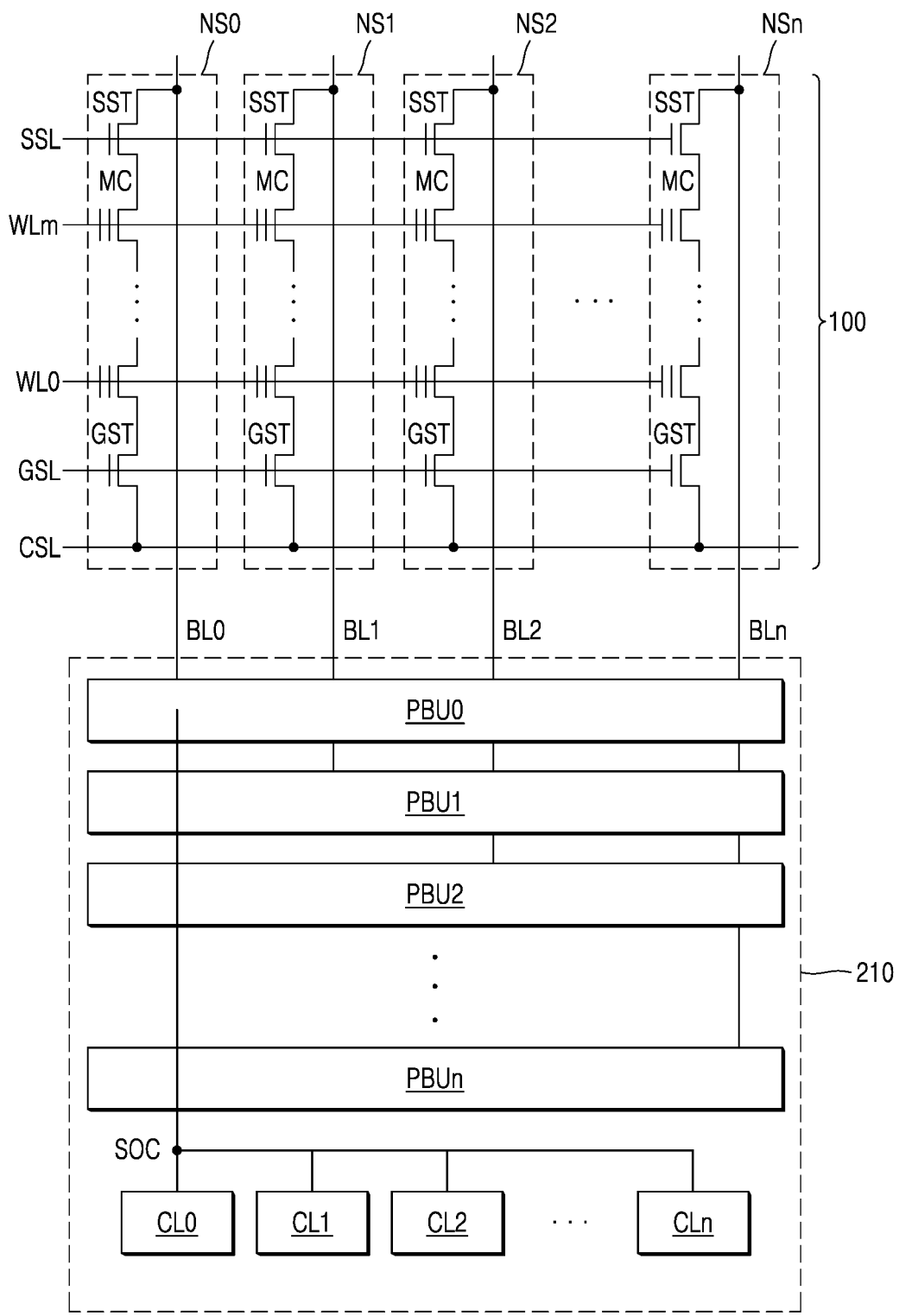
FIG. 5 is a schematic diagram of a connection of a memory cell array to a page buffer circuit, according to an embodiment of the inventive concept.

FIG. 5 is a schematic diagram of a connection of the memory cell array 100 to the page buffer circuit 210, according to an embodiment of the inventive concept. Referring to FIG. 5, the memory cell array 100 may include first through $(n+1)^{th}$ NAND strings NS0 through NSn, each of the first through $(n+1)^{th}$ NAND strings NS0 through NSn may include a ground select transistor GST connected to the ground select line GSL, a plurality of memory cells MC respectively connected to the first through $(m+1)^{th}$ word lines WL0 through WLm, and a string select transistor SST connected to the string select line SSL, and the ground select transistor GST, the plurality of memory cells MC, and the string select transistor SST may be connected to each other in series. In this case, m may be a positive integer.

The page buffer circuit 210 may include first through $(n+1)^{th}$ page buffer units PBU0 through PBUn. The first page buffer unit PB0 may be connected to the first NAND string NS0 via the first bit line BL0, and the $(n+1)^{th}$ page buffer unit PBUn may be connected to the $(n+1)^{th}$ NAND string NSn via the $(n+1)^{th}$ bit line BLn. In this case, n may be a positive integer. For example, n may be 7, and the page buffer circuit 210 may have a structure in which page buffer units of eight stages, or, the first through $(n+1)^{th}$ page buffer units PBU0 through PBUn are in a line. For example, the first through $(n+1)^{th}$ page buffer units PBU0 through PBUn may be in a row in an extension direction of the first through $(n+1)^{th}$ bit lines BL0 through BLn.

The page buffer circuit 210 may further include first through $(n+1)^{th}$ cache latches CL0 through CLn respectively corresponding to the first through $(n+1)^{th}$ page buffer units PBU0 through PBUn. For example, n may be 7, and the page buffer circuit 210 may have a structure in which the cache latches of eight stages or the first through $(n+1)^{th}$ cache latches CL0 through CLn in a line. For example, the first through $(n+1)^{th}$ cache latches CL0 through CLn may be in a row in an extension direction of the first through $(n+1)^{th}$ bit lines BL0 through BLn.

The sensing nodes of each of the first through $(n+1)^{th}$ page buffer units PBU0 through PBUn may be commonly connected to a combined sensing node SOC. In addition, the first through $(n+1)^{th}$ cache latches CL0 through CLn may be commonly connected to the combined sensing node SOC. Accordingly, the first through $(n+1)^{th}$ page buffer units PBU0 through PBUn may be connected to the first through $(n+1)^{th}$ cache latches CL0 through CLn via the combined sensing node SOC.

Figure 6:
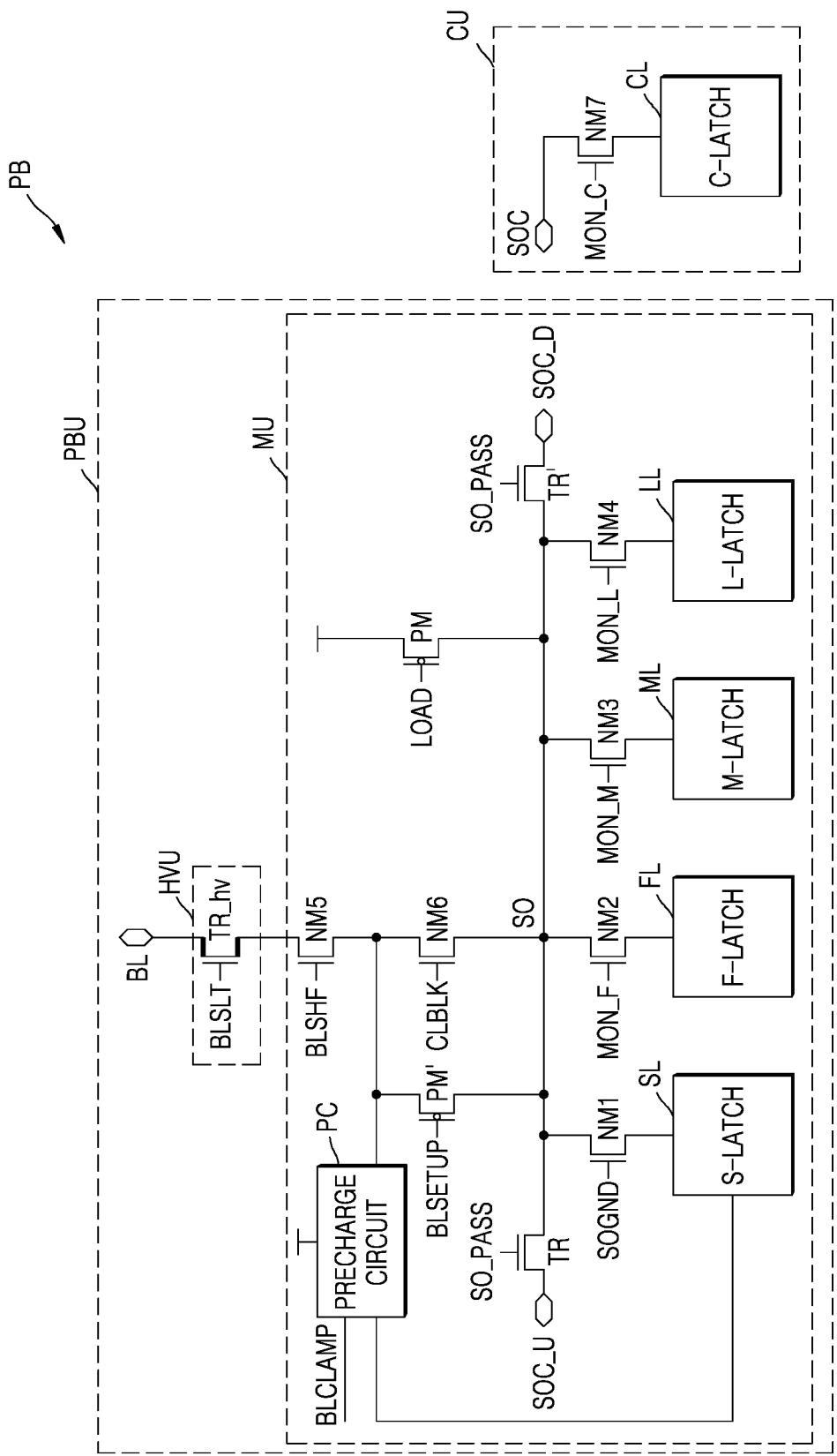
FIG. 6 illustrates a page buffer in FIG. 1, according to an embodiment of the inventive concept.

FIG. 6 illustrates in detail a page buffer PB according to an embodiment of the inventive concept.

Referring to FIG. 6, the page buffer PB may correspond to an example of the page buffer PB in FIG. 1. The page buffer PB may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit line select transistor TR_hv that is connected to a bit line BL and driven by a bit line select signal BLSLT. The bit line select transistor TR_hv may include a high voltage transistor, and accordingly, the bit line select transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a precharge circuit PC capable of controlling a precharge operation on the bit line BL or the sensing node SO based on the bit line clamping control signal BLCLAMP, and may further include a transistor PM' driven by a bit line setup signal BLSETUP.

The S-LATCH SL may, during a read operation or a program verify operation, store data stored in a memory cell MC or a sensing result of a threshold voltage of the memory cell MC. In addition, the S-LATCH SL may, during a program operation, be used to apply a program bit line voltage or a program inhibit voltage to the bit line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the data input/output line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit line select transistor TR_hv and the sensing node SO. The fifth transistor NM5 may be driven by a bit line shut-off signal BLSHF, and the sixth transistor NM6 may be driven by a bit line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In the present embodiment, the main unit MU may further include a pair of pass transistors connected to the sensing node SO, or first and second pass transistors TR and TR'. According to an embodiment, the first and second pass transistors TR and TR' may also be referred to as first and second sensing node connection transistors, respectively. The first and second pass transistors TR and TR' may be driven according to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU is the second page buffer unit PBU1 in FIG. 5, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through $(n+1)^{th}$ page buffer units PBU2 through PBUn.

During a program operation, the page buffer PB may verify whether the program is completed in a memory cell MC selected among the memory cells MC included in the NAND string connected to the bit line BL. The page buffer PB may store data sensed via the bit line BL during the program verify operation in the S-LATCH SL. The M-LATCH ML and the L-LATCH LL may be set in which target data is stored according to the sensed data stored in the S-LATCH SL. For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

Figure 7:
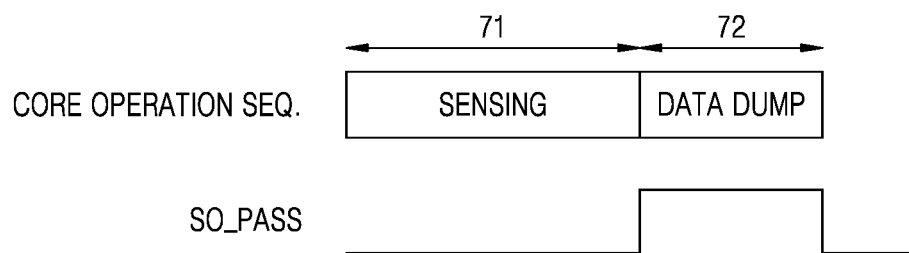
FIG. 7 is a timing diagram of an example of a voltage level of a pass control signal according to a core operation sequence, according to an embodiment of the inventive concept.

FIG. 7 is a timing diagram of an example of a voltage level of a pass control signal SO_PASS according to a core operation sequence, according to an embodiment of the inventive concept. Referring to FIGS. 6 and 7 together, the core operation sequence may represent the operation of the page buffer PB, and for example, the core operation sequence may include a data sensing period 71 in which a data sensing operation is performed and a data dumping period in which a data dumping operation is performed, or a data transfer period 72.

In the data sensing period 71, the pass control signal SO_PASS may be deactivated, and the first and second pass transistors TR and TR' may be turned off. Accordingly, the page buffer unit PBU may not be electrically connected to the combined sensing node SOC, for example, the page buffer unit PBU may not be electrically connected to the cache unit CU. In addition, the page buffer unit PBU may not also be electrically connected to an adjacent page buffer unit PBU. For example, the data sensing period 71 may include a precharge period in which an operation of precharging the voltage of the bit line BL or the voltage of the sensing node SO to a precharge level is performed, a development period in which an operation of electrically connecting the bit line BL to the sensing node SO and developing a voltage of the sensing node SO depend on a voltage level of the bit line BL is performed, and a sensing period in which an operation of sensing the voltage of the sensing node SO is performed.

In the data transfer period 72, the pass control signal SO_PASS may be activated, and the first and second pass transistors TR and TR' may be turned on. Accordingly, the page buffer unit PBU may be electrically connected to the combined sensing node SOC, for example, the page buffer unit PBU may be electrically connected to the cache unit CU. In addition, the page buffer unit PBU may be electrically connected to an adjacent page buffer unit PBU. For example, the data transfer period 72 may include a period in which an operation of dumping read data stored in the S-LATCH SL to the C-LATCH CL is performed, and a period in which an operation of dumping program data stored in the C-LATCH CL to the S-LATCH SL is performed, or a period in which data stored in the C-LATCH CL is transferred to a data input/output circuit, etc.

Figure 8:
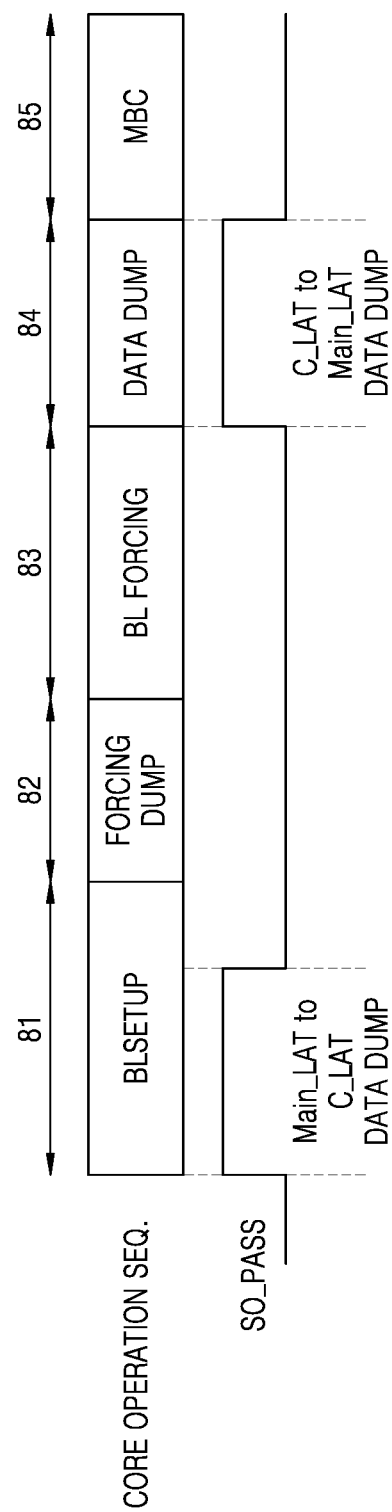
FIG. 8 is a timing diagram of another example of a voltage level of a pass control signal according to a core operation sequence, according to an embodiment of the inventive concept.

FIG. 8 is a timing diagram of another example of a voltage level of the pass control signal SO_PASS according to a core operation sequence, according to an embodiment of the inventive concept.

Referring to FIGS. 6 and 8 together, the core operation sequence may represent the operation of the page buffer PB. For example, the core operation sequence may be a bit line setup period 81, a forcing dumping period 82, and a bit line forcing period 83, a data transfer period or a data dumping period 84, and a mass bit count (MBC) period 85.

In the bit line setup period 81, the pass control signal SO_PASS may be activated, and the first and second pass transistors TR and TR' may be turned on. In this case, the sensing node SO and the combined sensing node SOC may be electrically connected to each other, and accordingly, data may be dumped from the main latch included in the page buffer unit PBU (for example, the S-LATCH SL, the F-LATCH FL, the M-LATCH ML or the L-LATCH LL) to the C-LATCH CL.

In the forcing dumping period 82 and the bit line forcing period 83, the pass control signal SO_PASS may be deactivated, and the first and second pass transistors TR and TR' may be turned off. Accordingly, the page buffer unit PBU may not be electrically connected to the cache unit CU, and may not also be electrically connected to the adjacent page buffer unit PBU. In the forcing dumping period 82, when the program is performed, the dumping operation for selecting a bit line BL to be forced to a bias less than a power supply voltage level may be performed. For example, data may be dumped from the F-LATCH FL to the S-LATCH SL. In the bit line forcing period 83, a voltage applied to the bit line BL may vary according to a value stored in the F-LATCH FL during a program execution.

In the data transfer period 84, the pass control signal SO_PASS may be activated, and the first and second pass transistors TR and TR' may be turned on. For example, in the data transfer period 84, a dumping operation to mark the data, which is stored in the S-LATCH SL connected to the memory cells MC which has failed as a result of the program verification operation among the memory cells MC which are to be programmed in the target program state when the program is executed, to logic low may be performed. In this case, because the sensing node SO and the combined sensing node SOC are electrically connected to each other, the logic low data may be dumped from the C-LATCH CL to the main latch (for example, the S-LATCH SL).

In the mass bit count period 85, the pass control signal SO_PASS may be deactivated, and the first and second pass transistors TR and TR' may be turned off. Accordingly, the page buffer unit PBU may not be electrically connected to the cache unit CU, and may not also be electrically connected to the adjacent page buffer unit. In the mass bit counting period 85, the number of S-LATCHs SL marked as logic low in the previous data transfer period 84 may be counted.

FIG. 9 is a plan view of a page buffer circuit 210a according to an embodiment of the inventive concept. Referring to FIGS. 2 and 9 together, the first semiconductor layer L1 may include the memory cell array 100, and the memory cell array 100 may include the plurality of memory cells MC respectively connected to the plurality of bit lines BL extending in the first horizontal direction HD1. In an embodiment, the plurality of bit lines BL may be implemented as a first metal layer M1. For example, the first metal layer M1 may be formed by using double patterning technology (DPT).

The second semiconductor layer L2 may include the page buffer circuit 210a, and a first lower metal layer LM0 extending in the first horizontal direction HID1 may be above the page buffer circuit 210a. A third lower metal layer LM2 extending in the first horizontal direction HD1 may be above the first lower metal layer LM0. Although not illustrated, a second lower metal layer extending in the second horizontal direction HD2 may be further arranged between the first lower metal layer LM0 and the third lower metal layer LM2. For example, the first and third lower metal layers LM0 and LM2 may be formed without using DPT, and accordingly, a pitch of metal patterns included in each of the first and third lower metal layers LM0 and LM2 may be greater than a pitch of metal patterns included in the first metal layer M1.

The page buffer circuit 210a may include first through eighth page buffer units PBU0 through PBU7 in the first horizontal direction HD1 and first through eighth cache units CU0 through CU7 in the first horizontal direction HD1. The first through eighth page buffer units PBU0 through PBU7 may be in a main region MR, the first through eighth cache units CU0 through CU7 may be in a cache region CR, and the main region MR and the cache region CR may be adjacent to each other in the first horizontal direction HD1. The first and third lower metal layers LM0 and LM2 may be used to transmit a control signal to each of transistors included in the first through eighth page buffer units PBU0 through PBU7 and the first through eighth cache units CU0 through CU7, or may be used to connect each of the transistors to a power terminal or a ground terminal.

Figure 10:
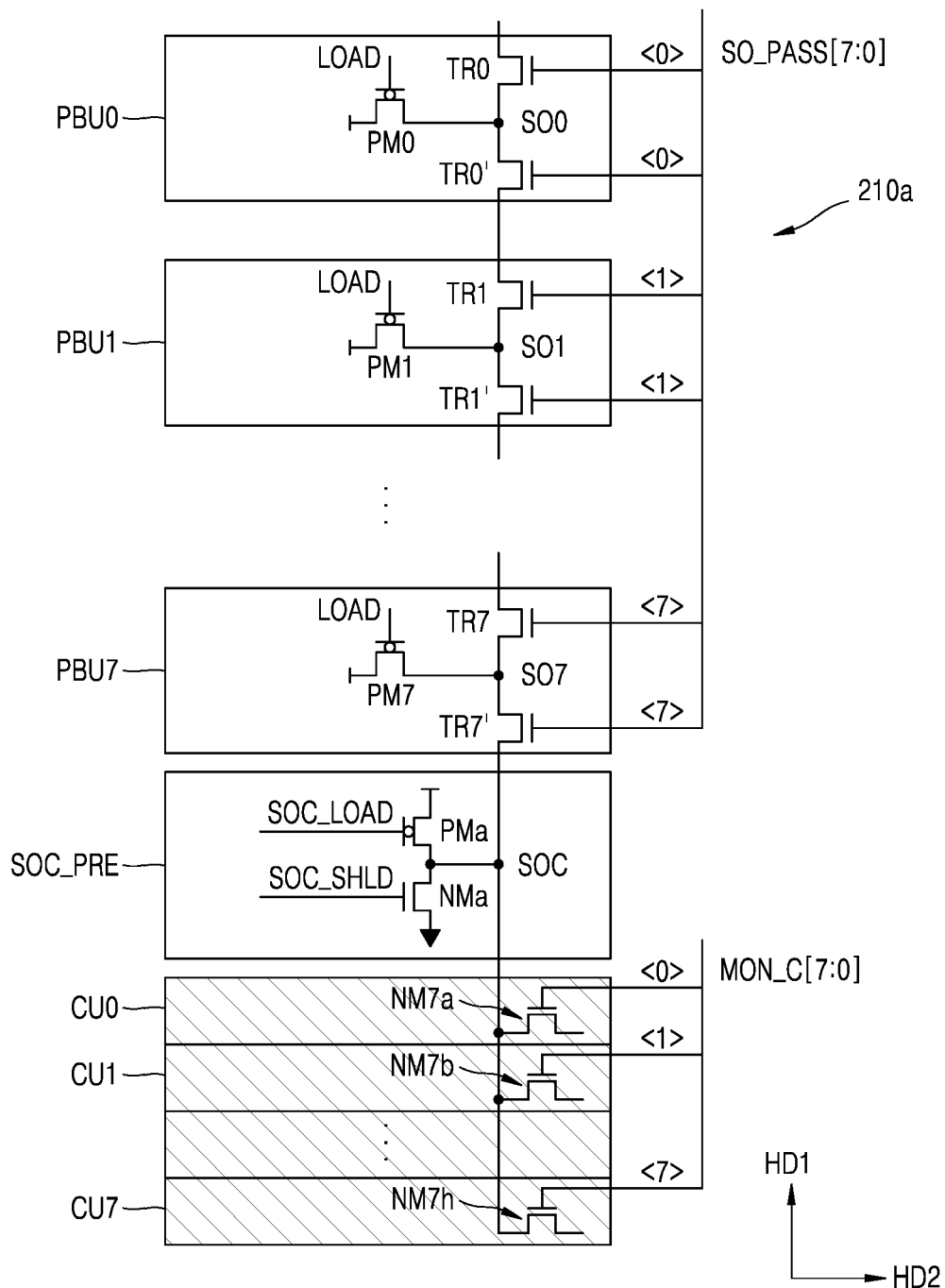
FIG. 10 is a circuit diagram of a page buffer circuit according to an embodiment of the inventive concept.

FIG. 10 is a circuit diagram of the page buffer circuit 210a according to an embodiment of the inventive concept. Hereinafter, the configuration of the page buffer circuit 210a will be described in detail with reference to FIGS. 9 and 10 together.

Each page buffer unit may include two pass transistors, and accordingly, the page buffer circuit 210a may include 16 pass transistors TR0, TR0', ..., TR7, and TR7', and the 16 pass transistors TR0, TR0', ..., TR7, and TR7' may be connected to each other in series. For example, the first page buffer unit PBU0 may include the first and second pass transistors TR0 and TR0' connected in series. For example, the first pass transistor TR0 may be adjacent to a first boundary of the first page buffer unit PBU0, the second pass transistor TR0' may adjacent to a second boundary of the first page buffer unit PBU0, and the first boundary and the second boundary may face each other. For example, the first and second pass transistors TR0 and TR0' may be implemented as NMOS transistors, and accordingly, may be at both ends of the P well of the first page buffer unit PBU0, but the invention is not limited thereto. In an embodiment, another semiconductor device, for example, a PMOS transistor, may be further arranged between the first boundary of the first page buffer unit PBU0 and the first pass transistor TR0. Similarly, another semiconductor device, for example, a PMOS transistor, may be further arranged between the second boundary of the first page buffer unit PBU0 and the second pass transistor TR0'.

For example, the first page buffer unit PBU0 may further include, between the first pass transistor TR0 and the second pass transistor TR0', a plurality of transistors arranged in the first horizontal direction (for example, the S-LATCH SL, the F-LATCH FL, the M-LATCH ML and the L-LATCH LL, the first through sixth transistors NM1 through NM6 in FIG. 6, or the like). Hereinafter, a description will be given focusing on the configuration of the first page buffer unit PBU0, and each of the second through eighth page buffer units PBU1 through PBU7 may be configured the same as the first page buffer unit PBU0.

The first pass transistor TR0 may include a source S0, a drain D0, and a gate G0. The source S0 of the first pass transistor TR0 may be connected to a first terminal (for example, SOC_U in FIG. 6), and the drain DO of the first pass transistor TR0 may be connected to a first sensing node SO0. A first pass control signal SO_PASS<0> of a pass control signal SO_PASS[7:0] may be applied to the gate G0 of the first pass transistor TR0. Hereinafter, it will be described that the pass control signal SO_PASS[7:0] includes the first through eighth pass control signals SO_PASS<0> through SO_PASS<7> respectively corresponding to the first through eighth page buffer units PBU0 through PBU7.

The second pass transistor TR0' may include a source S0', a drain D0', and a gate G0'. The source S0' of the second pass transistor TR0' may be connected to the first sensing node SO0, and the drain DO' of the second pass transistor TR0' may be connected to a second terminal (for example, SOC_D in FIG. 6). The first pass control signal SO_PASS<0> may be applied to the gate G0' of the second pass transistor TR0'.

The second page buffer unit PBU1 may include the first and second pass transistors TR1 and TR1' connected in series. The first pass transistor TR1 may include a source S1, a drain D1, and a gate G1, and the second pass transistor TR1' may include a source S1', a drain D1', and a gate G1'. The second pass control signal SO_PASS<1> of the pass control signal SO_PASS[7:0] may be applied to the gates G1 and G1' of the first and second pass transistors TR1 and TR1', respectively.

The eighth page buffer unit PBU7 may include the first and second pass transistors TR7 and TR7' connected in series. The first pass transistor TR7 may include a source S7, a drain D7, and a gate G7, and the second pass transistor TR7' may include a source S7', a drain D7', and a gate G7'. The eighth pass control signal SO_PASS<7> of the pass control signal SO_PASS[7:0] may be applied to the gates G7 and G7' of the first and second pass transistors TR7 and TR7', respectively. However, the invention is not limited thereto, and in some embodiment, a combined sensing node pass control signal SOC_PASS may be applied to the gate G7' of the second pass transistor TR7'.

The first cache unit CU0 may include a monitor transistor NM7a, and the monitor transistor NM7a may include a source S, a drain D, and a gate G (refer to FIG. 9). For example, the monitor transistor NM7a may correspond to the transistor NM7 in FIG. 6. The source S of the monitor transistor NM7a may be connected to the combined sensing node SOC, and a first cache monitoring signal MON_C[0] of a cache monitoring signal MON_C[7:0] may be applied to the gate G of the monitor transistor NM7a. Hereinafter, it will be described that the cache monitoring signal MON_C[7:0] includes the first through eighth cache monitoring signal MON_C<0> through MON_C<7> respectively corresponding to the first through eighth page buffer units PBU0 through PBU7. Although not illustrated, the first cache unit CU0 may further include a plurality of transistors in the first horizontal direction HD1 (for example, the plurality of transistors included in the C-LATCH CL in FIG. 6). Each of the second through eighth cache units CU1 through CU7 may have the same configuration as the first cache unit CU0. The monitor transistors NM7a through NM7h included in each of the first through eighth cache units CU0 through CU7 may be commonly connected in parallel to the combined sensing node SOC. Sources of each of the monitor transistors NM7a through NM7h may be commonly connected to the combined sensing node SOC.

In the first page buffer unit PBU0, the drain DO of the first pass transistor TR0 and the source S0' of the second pass transistor TR0' may be connected to each other via a first conductive line or a first metal pattern MT0a. The first metal pattern MT0a may correspond to the first sensing node SO0, and accordingly, may be referred to as the first sensing node line. In the second page buffer unit PBU1, the drain D1 of the first pass transistor TR1 and the source S1' of the second pass transistor TR1' may be connected to each other via a first conductive line or a first metal pattern MT0b. The first metal pattern MT0b may correspond to the second sensing node SO1, and accordingly, may be referred to as the second sensing node line.

In the eighth page buffer unit PBU7, the drain D7 of the first pass transistor TR7 and the source S7' of the second pass transistor TR7' may be connected to each other via a first metal pattern MT0c. The first metal pattern MT0c may correspond to the eighth sensing node SO7, and accordingly, may be referred to as an eighth sensing node line. In the eighth page buffer unit PBU7, the drain D7' of the second pass transistor TR7' and the source S of the monitor transistor NM7a of the first cache unit CU0 may be connected to each other via a first metal pattern MT0d. In this case, the first metal pattern MT0d may also be connected to a precharge circuit SOC_PRE. The first metal pattern MT0d may correspond to the combined sensing node SOC, and accordingly, may be referred to as a combined sensing node line. In an embodiment, the first metal patterns MT0a, MT0b, MT0c, and MT0d may be implemented as the first lower metal layer LM0, and may occupy one track of the first lower metal layer LM0.

The drain D0' of the second pass transistor TR0' of the first page buffer unit PBU0 and the source S1 of the first pass transistor TR1 of the second page buffer unit PBU1 may be connected to each other via a second conductive line or the second metal pattern MT1a, and accordingly, the second metal pattern MT1a may be referred to as a node connection line. For example, the second metal pattern MT1a may be implemented as the third lower metal layer LM2, and may occupy one track of the third lower metal layer LM2. However, the invention is not limited thereto, and the second metal pattern MT1a may be implemented as the second lower metal layer.

According to the present embodiment, when the pass control signal SO_PASS is activated, the first and second pass transistors TR0 through TR7 and TR0' through TR7' may be turned on, and accordingly, the first and second pass transistors TR0 through TR7 and TR0' through TR7' respectively included in the first through eighth page buffer units PBU0 through PBU7 may be connected to each other in series, and all of the first through eighth sensing nodes SO0 through SO7 may be connected to the combined sensing node SOC. The first and second sensing nodes SO0 and SO1 may be connected to each other via the first metal patterns MT0a and MT0b and the second metal pattern MT1a, and the eighth sensing node SO7 and the combined sensing node SOC may be connected to each other via the first metal patterns MT0c and MT0d.

The first metal patterns MT0a, MT0b, and MT0c respectively corresponding to the first, second, and eighth sensing node lines, the second metal pattern MT1a corresponding to a node connection line, and the first metal pattern MT0d corresponding to the combined sensing node line may constitute a data transfer line. As described above, according to the present embodiment, eight data transfer lines for respectively connecting the first through eighth page buffer units PBU0 through PBU7 to the first through eighth cache units CU0 through CU7 may not be separately needed, and the sensing node lines included in each of the first through eighth page buffer units PBU0 through PBU7 may be used as the data transfer lines. Accordingly, because the number of metal lines required for wiring of the page buffer circuit 210a may be reduced, the complexity of the layout may be reduced, and the size of the page buffer circuit 210a may be reduced.

Each of the first through eighth page buffer units PBU0 through PBU7 may further include first through eighth precharge transistors PM0 through PM7. In the first page buffer unit PBU0, the first precharge transistor PM0 may be connected between the first sensing node SO0 and a voltage terminal to which a precharge voltage is applied, and may include a gate to which a load signal LOAD is applied. The first precharge transistor PM0 may precharge the first sensing node SO0 to a precharge level of the precharge voltage in response to the load signal LOAD.

The main region MU may include contact regions THVa and THVd. The contact region THVa may be between the first and second page buffer units PBU0 and PBU1, and the contact region THVd may be between a seventh page buffer unit and the eighth page buffer unit PBU7. First and second bit line contacts CT0 and CT1 respectively connected to the first and second bit lines may be in the contact region THVa. The first bit line contact CT0 may be connected to the first page buffer unit PBU0, and the second bit line contact CT1 may be connected to the second page buffer unit PBU1.

The page buffer circuit 210a may further include a precharge circuit SOC_PRE between the eighth page buffer unit PBU7 and the first cache unit CU0. The precharge circuit SOC_PRE may include a precharge transistor PMa and a shielding transistor NMa for precharging the combined sensing node SOC. The precharge transistor PMa may be driven by a combined sensing node load signal SOC_LOAD, and when the precharge transistor PMa is turned on, the combined sensing node SOC may be precharged to the precharge level. The shielding transistor NMa may be driven by a combined sensing node shielding signal SOC_SHLD, and when the shielding transistor NMa is turned on, the combined sensing node SOC may be discharged to a ground voltage.

As a transistor width WD decreases according to the miniaturization of the process, the area of the region occupied by the page buffer circuit 210a may decrease. For example, the transistor width WD may correspond to a size of the source S0 or the drain DO of the first pass transistor TR0 in the second horizontal direction HD2. As the transistor width WD decreases, the size of the first page buffer unit PBU0 in the second horizontal direction HD2 may decrease. However, despite the decrease in the transistor width WD, a pitch of the first lower metal layer LM0 may not decrease. Accordingly, the number of wirings of the first lower metal layer LM0 on the first page buffer unit PBU0, the size of which is reduced in the second horizontal direction HD2, that is, the number of metal patterns, may also be reduced. For example, the number of metal patterns of the first lower metal layer LM0 corresponding to the first page buffer unit PBU0 may be reduced from six to four.

In this manner, when the number of metal patterns of the first lower metal layer LM0 corresponding to the first page buffer unit PBU0 decreases, the sensing reliability of the first page buffer unit PBU0 may decrease. For example, during the sensing operation, to prevent a coupling between the first sensing node SO0 and an adjacent node, a metal pattern adjacent to the first sensing node SO0 is used as a shielding line to which a fixed bias is applied. However, when the metal pattern corresponding to the shielding line is removed due to the reduction of the metal pattern, an issue of voltage variation at the first sensing node SO0 due to the coupling between the first sensing node SO0 and the adjacent node may occur, and as a result, the sensing reliability of the first page buffer unit PBU0 may be deteriorated.

According to the present embodiment, by separately arranging the first page buffer unit PBU0 and the first cache unit CU0, the degree of freedom of the metal patterns include in the first and third lower metal layers LM0 and LM2 on the first page buffer unit PBU0 may increase, and thus at least one of the metal patterns included in the first and third lower metal layers LM0 and LM2 may be used as a shielding line for the first sensing node SO0. Accordingly, an increase in voltage fluctuation at the first sensing node SO0 may be prevented, and thus, a decrease in the sensing reliability of the first page buffer unit PBU0 may be prevented.

In some examples, in a structure in which the first through eighth page buffer units PBU0 through PBU7 are separate from the first through eighth cache units CU0 through CU7, when eight signal lines for respectively connecting the first through eighth page buffer units PBU0 through PBU7 to the first through eighth cache units CU0 through CU7 are arranged, the size of the page buffer circuit 210a in the second horizontal direction HD2 may increase again.

According to the present embodiment, the first through eighth sensing nodes SO0 through SO7 may be connected to each other by using the first and second pass transistors TR0 through TR7 and TR0' through TR7' included in each of the first through eighth page buffer units PBU0 through PBU7, and the first through eighth sensing nodes SO0 through SO7 may be connected to the first through eighth cache units CU0 through CU7 via the combined sensing node SOC, respectively. In this case, because a sensing node line for connecting the first and second pass transistors to each other is implemented by using the metal patterns of one track of the first lower metal layer LM0 (for example, MT0a and MT0b), an increase in a size of the page buffer circuit 210a in the second horizontal direction HD2 may be prevented.

Figure 11:
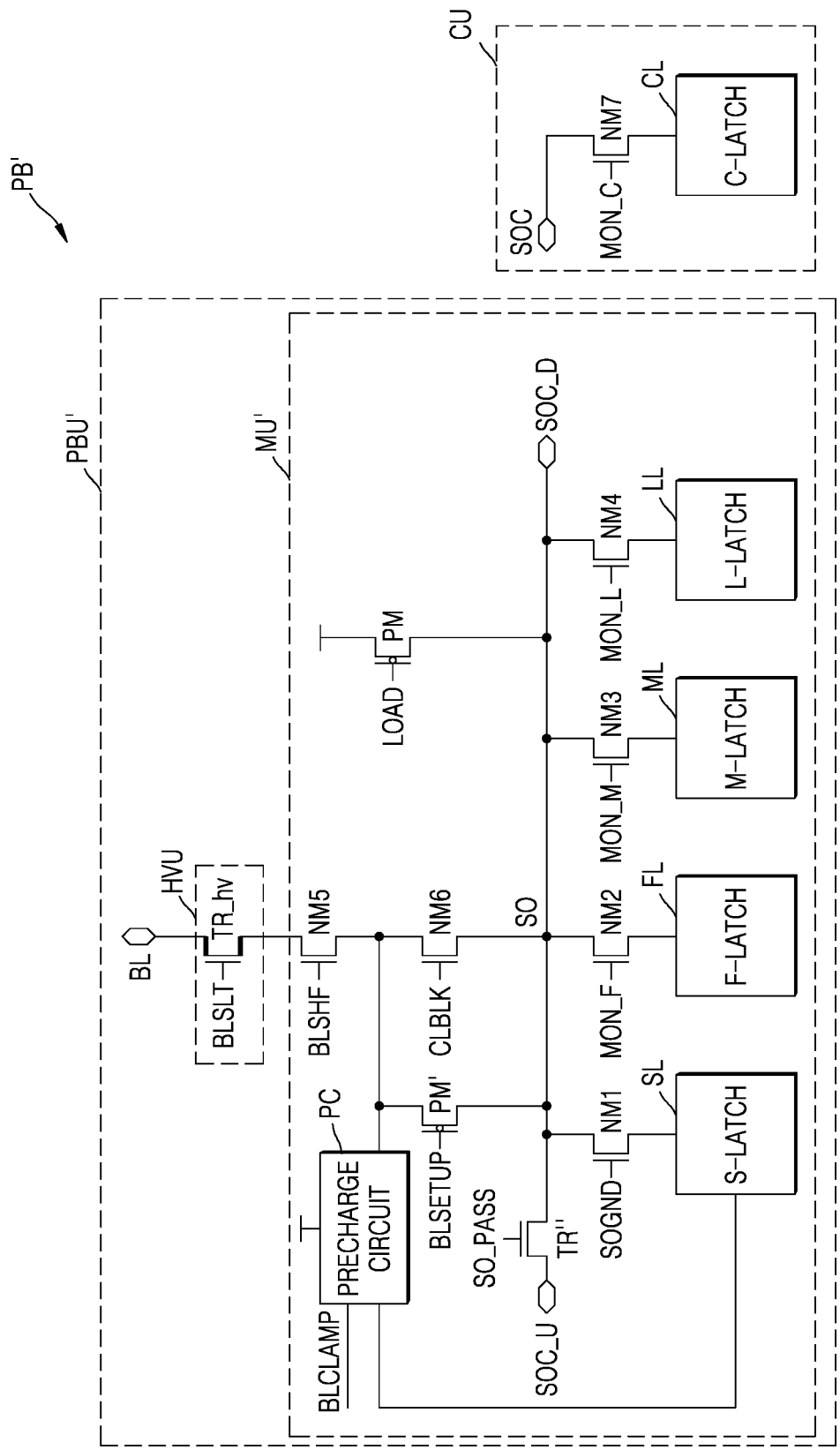
FIG. 11 illustrates in detail a page buffer according to an embodiment of the inventive concept.

FIG. 11 illustrates in detail a page buffer PB' according to an embodiment of the inventive concept. Referring to FIG. 11, the page buffer PB' may include a page buffer unit PBU' and the cache unit CU, and the page buffer unit PBU' may include a main unit MU' and the high voltage unit HVU. The page buffer PB' may correspond to a modified example of the page buffer PB in FIG. 6. While the page buffer unit PBU in FIG. 6 includes first and second pass transistors TR and TR', the page buffer unit PBU' according to the present embodiment may include one pass transistor TR". The pass transistor TR" may be driven according to the pass control signal SO_PASS, and may be connected between the first terminal SOC_U and the second terminal SOC_D.

For example, a source of the pass transistor TR" may be connected to the first terminal SOC_U, and a drain of the pass transistor TR" may be connected to the sensing node SO and the second terminal SOC_D. However, the invention is not limited thereto, and as another example, the source of the pass transistor TR" may be connected to the first terminal SOC_U and the sensing node SO, and the drain of the pass transistor TR" may be connected to the second terminal SOC_D. In an embodiment, a pass transistor included in one of two adjacent page buffer units in the first horizontal direction HD1 may be connected between the first terminal SOC_U and the sensing node SO, and the pass transistor included in the other page buffer unit may be connected between the sensing node SO and the second terminal SOC_D.

Figure 12:
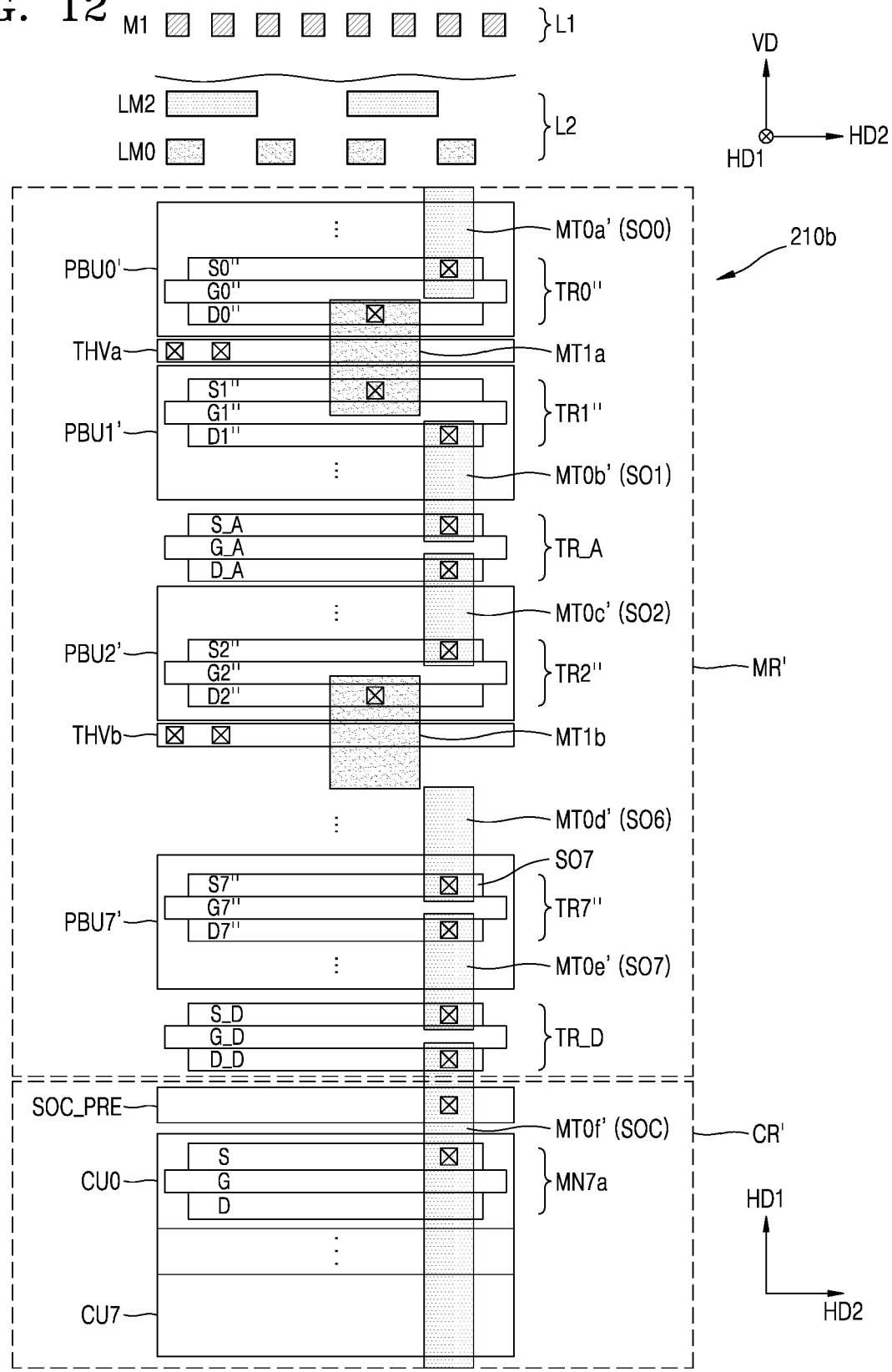
FIG. 12 is a plan view of a page buffer circuit according to an embodiment of the inventive concept.
Figure 13:
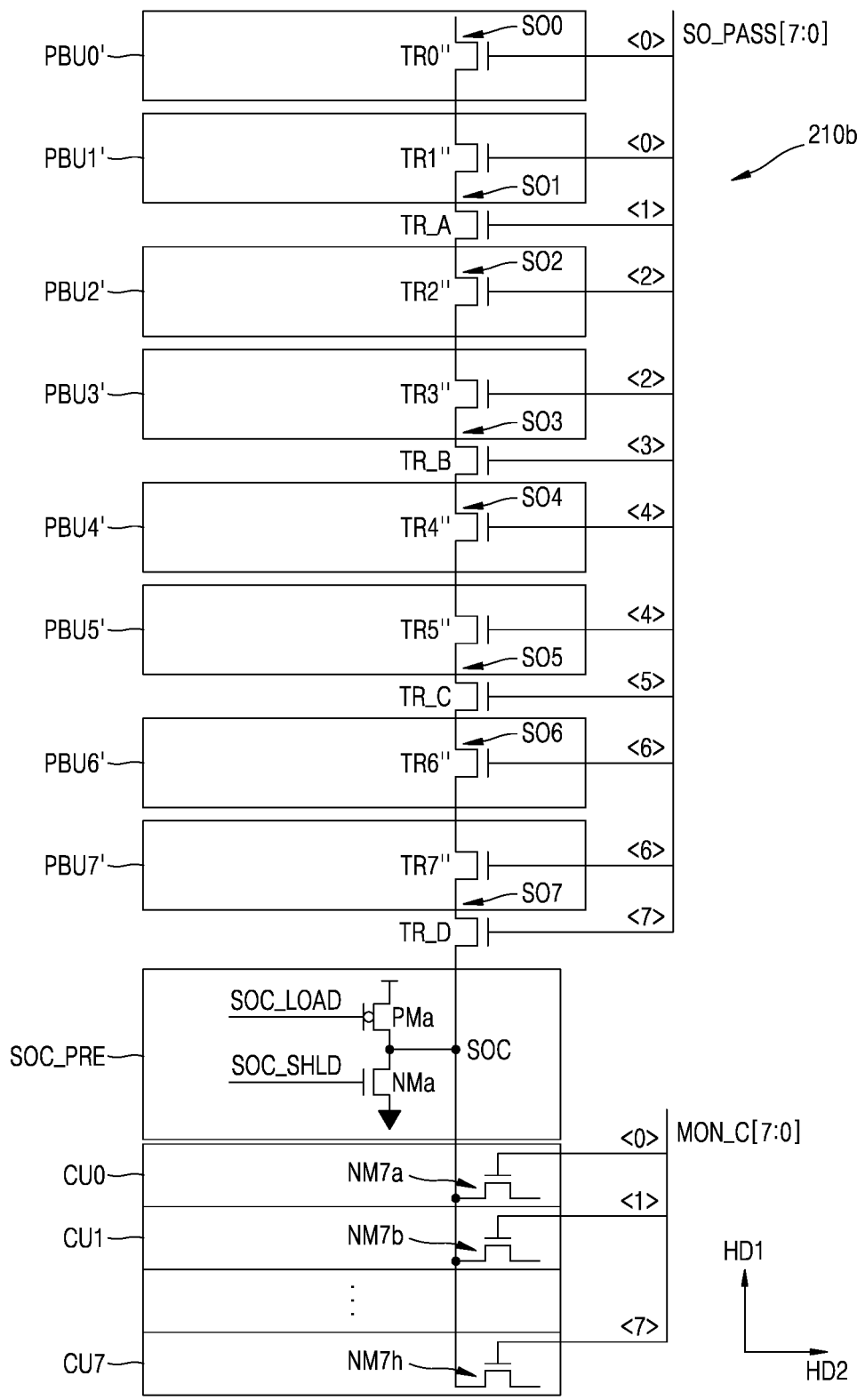
FIG. 13 is a circuit diagram of a page buffer circuit according to an embodiment of the inventive concept.

FIG. 12 is a plan view of a page buffer circuit 210b according to an embodiment of the inventive concept, and FIG. 13 is a circuit diagram of the page buffer circuit 210b according to an embodiment of the inventive concept. The page buffer circuit 210b may include the page buffer PB' in FIG. 11 and correspond to a modified example of the page buffer circuit 210a in FIGS. 9 and 10. Referring to FIGS. 12 and 13, the page buffer circuit 210b may include first through eighth page buffer units PBU0' through PBU7' in the first horizontal direction HID1 and the first through eighth cache units CU0 through CU7 in the first horizontal direction HD1. The first through eighth page buffer units PBU0' through PBU7' may be in a main region MR', the first through eighth cache units CU0 through CU7 may be in a cache region CR', and the main region MR' and the cache region CR' may be adjacent to each other in the first horizontal direction HD1.

Each page buffer unit may include one pass transistor, and the page buffer circuit 210b may further include one pass transistor for connecting two adjacent page buffer units. Accordingly, it may be understood that 1.5 pass transistors per page buffer unit are included. The first through eighth page buffer units PBU0' through PBU7' may include first through eighth pass transistor TR0" through TR7", respectively, and the page buffer circuit 210b may further include four pass transistors TR_A through TR_D. Accordingly, the page buffer circuit 210b may include 12 pass transistors TR0" through TR7" and TR_A through TR_D, and the 12 pass transistors TR0" through TR7" and TR_A through TR_D may be connected to each other in series.

The pass transistor TR_A may be between second and third page buffer units PBU1' and PBU2', the pass transistor TR_B may be between fourth and fifth page buffer units PBU3' and PBU4', the pass transistor TR_C may be between sixth and seventh page buffer units PBU5' and PBU6', and the pass transistor TR_D may be between eighth page buffer unit PBU7' and the precharge circuit SOC_PRE.

For example, the first page buffer unit PBU0' may include a pass transistor TR0", and a first pass control signal SO_PASS<0> may be applied to the gate G0" of the pass transistor TR0". For example, the pass transistor TR0" may be adjacent to a second boundary of the first page buffer unit PBU0'. For example, the first page buffer unit PBU0' may further include, between the first boundary and the pass transistor TR0", a plurality of transistors arranged in the first horizontal direction (for example, the S-LATCH SL, the F-LATCH FL, the M-LATCH ML and the L-LATCH LL, the first through sixth transistors NM1 through NM6 in FIG. 11, or the like). In addition, another semiconductor device, for example, a PMOS transistor, may be further included between the pass transistor TR0" and the second boundary of the first page buffer unit PBU0'.

For example, the second page buffer unit PBU1' may include a pass transistor TR1", and the first pass control signal SO_PASS<0> may be applied to the gate G1" of the pass transistor TR1". For example, the pass transistor TR1" may be adjacent to a first boundary of the second page buffer unit PBU1'. For example, the second page buffer unit PBU1' may further include a plurality of transistors between the pass transistor TR1" and the second boundary in the first horizontal direction HD1. In addition, another semiconductor device, for example, a PMOS transistor, may be further included between the pass transistor TR1" and the first boundary of the second page buffer unit PBU1'.

The page buffer circuit 210b may further include first metal patterns MT0a' through MT0f extending in the first horizontal direction HD1. For example, the first metal patterns MT0a' through MT0f may be included in the first lower metal layer LM0. In this case, the first metal patterns MT0a' through MT0e' may correspond to the first through eighth sensing nodes SO0 through SO7, respectively, and accordingly, may be referred to as sensing node lines. For example, lengths of the first metal patterns MT0a' through MT0e' in the first horizontal direction HD1 may be the same. In addition, the first metal pattern MT0f may correspond to the combined sensing node SOC, and accordingly, may be referred to as a combined sensing node line. In addition, the page buffer circuit 210b may further include the second metal patterns MT1a and MT1b extending in the first horizontal direction HD1. For example, the second metal patterns MT1a and MT1b may be included in the third lower metal layer LM2. In this case, the second metal pattern MT1a may cross the contact region THVa, and the second metal pattern MT1b may cross a contact region THVb.

The first pass control signal SO_PASS<0> may be applied to gates G0" and G1" of the pass transistors TR0" and TR1", respectively, and a second pass control signal SO_PASS<1> may be applied to a gate G_A of the pass transistor TR_A. A third pass control signal SO_PASS<2> may be applied to gates G2" and G3" of the pass transistors TR2" and TR3", respectively, and a fourth pass control signal SO_PASS<3> may be applied to a gate of the pass transistor TR_B. A fifth pass control signal SO_PASS<4> may be applied to gates G4" and G5" of the pass transistors TR4" and TR5", respectively, and a sixth pass control SO_PASS<5> may be applied to a gate of the pass transistor TR_C. A seventh pass control signal SO_PASS<6> may be applied to gates G6" and G7" of the pass transistors TR6" and TR7", respectively, and an eighth pass control signal SO_PASS<7> may be applied to a gate G_D of the pass transistor TR_D.

A source S0" of the pass transistor TR0" may be connected to the first sensing node SO0, and a drain D0" may be connected to a source S1" of the pass transistor TR1" via the second metal pattern MT1a. A drain D1" of the pass transistor TR1" and a source S_A of the pass transistor TR_A may be connected to each other via the second sensing node SO1. A drain D_A of the pass transistor TR_A may be connected to a source S2" of the pass transistor TR2" via a third sensing node S02. A drain D7" of the pass transistor TR7" may be connected to a source S_D of the pass transistor TR_D via an eighth sensing node SO7.

Figure 14:
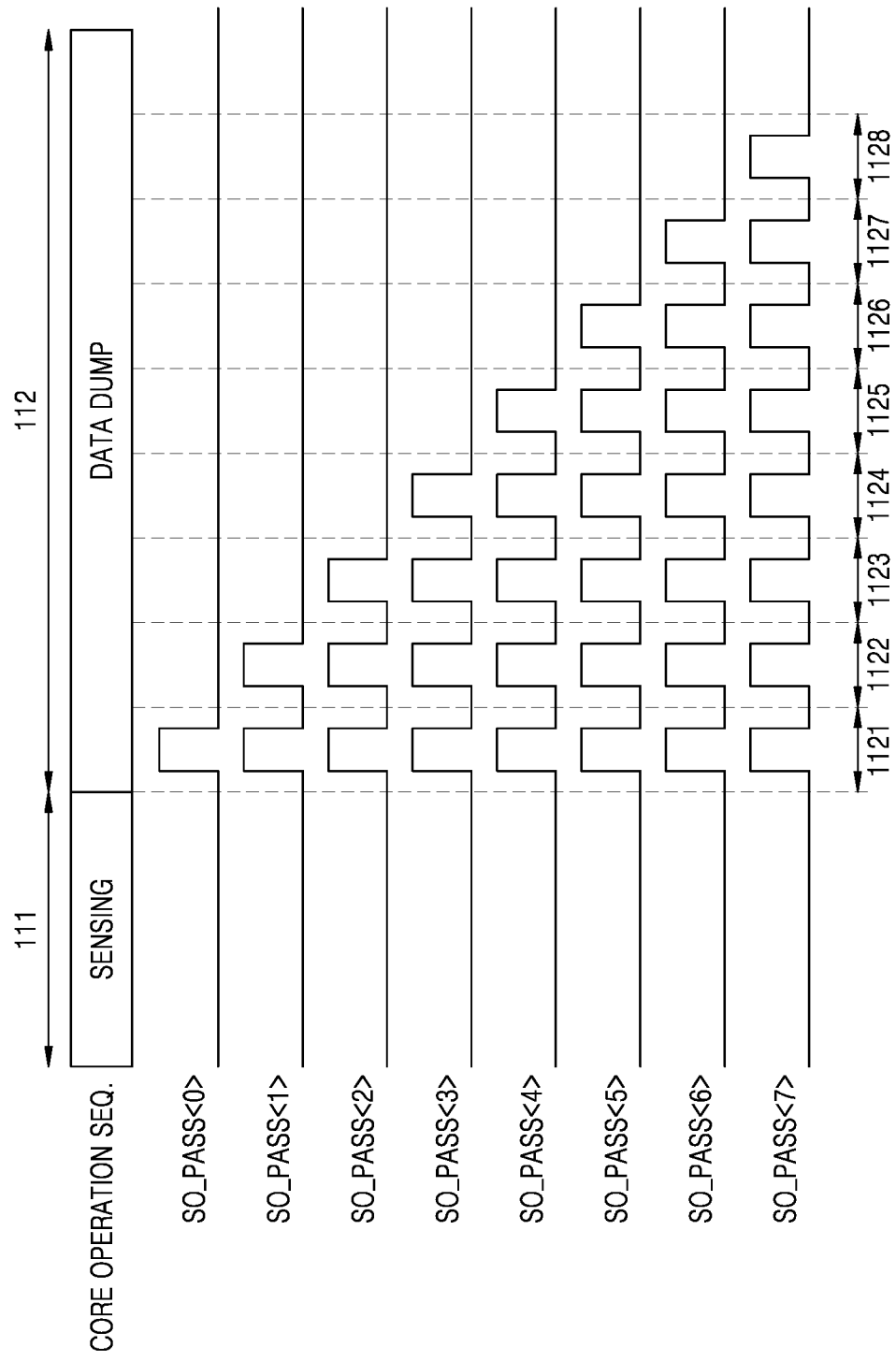
FIG. 14 is a timing diagram of voltage levels of a plurality of sensing node pass control signals according to a core operation sequence, according to an embodiment of the inventive concept.

FIG. 14 is a timing diagram of voltage levels of the first through eighth sensing node pass control signals SO_PASS<0> through SO_PASS<7> according to a core operation sequence, according to an embodiment of the inventive concept. Referring to FIGS. 10 and 14 together, the core operation sequence may include a data sensing period 111 in which the data sensing operation is performed and a data dumping period or a data transfer period 112 in which the data dumping operation is performed. However, the invention is not limited thereto, and the timing diagram of FIG. 14 may also be applied to the page buffer circuit 210b illustrated in FIG. 13. Accordingly, the first through eighth pass control signals SO_PASS<0> through SO_PASS<7> may be applied to the pass transistors TR0" through TR7" and TR_A through TR_D included in the page buffer circuit 210b.

In the data sensing period 111, all of the first through eighth pass control signals SO_PASS<0> through SO_PASS<7> may be deactivated, and all of the first and second pass transistors TR0 through TR7 and TR0' through TR7' which are included in each of the first through eighth page buffer units PBU0 through PBU7 may be turned off. Accordingly, the first through eighth page buffer units PBU0 through PBU7 may not be electrically connected to each other, and the first through eighth sensing nodes SO0 through SO7 may be electrically isolated from each other. In addition, the first through eighth sensing nodes SO0 through SO7 may not be electrically connected to the combined sensing node SOC, that is, the first through eighth page buffer units PBU0 through PBU7 may not be electrically connected to the first through eighth cache units CU0 through CU7.

In the data transfer period 112, to individually control connections between the first through eighth page buffer units PBU0 through PBU7 and the first through eighth cache units CU0 through CU7, the first and second pass transistors TR0 through TR7 and TR0' through TR7' included in each of the first through eighth page buffer units PBU0 through PBU7 may be selectively turned on. As a result, an amount of current consumed in the data dumping operation may be reduced.

In a first data transfer period 1121, all of the first through eighth pass control signals SO_PASS<0> through SO_PASS<7> may be activated, and accordingly, all of the first and second pass transistors TR0 through TR7 and TR0' through TR7' included in the first through eighth page buffer units PBU0 through PBU7 may be turned on and connected in series. At this time, the first sensing node SO0 may be connected to the combined sensing node SOC via the second through eighth sensing nodes SO1 through SO7, and the data dumping operation may be performed between the main latch in the first page buffer unit PBU0 (for example, one of the S-LATCH SL, the F-LATCH FL, the M-LATCH ML, and the L-LATCH LL in FIG. 6) and a cache latch in the first cache unit CU0 (for example, the C-LATCH CL in FIG. 6). For example, the main latch in the first page buffer unit PBU0 and the cache latch in the first cache unit CU0 may be electrically connected to each other in response to the transistor NM7 (in FIG. 6) of the first cache unit CU0 being activated and at least one of the first through fourth transistors NM1 through NM4 (in FIG. 6) of the first page buffer unit PBU0 being activated.

In a second data transfer period 1122, the first pass control signal SO_PASS<0> may be deactivated, and the second through eighth pass control signals SO_PASS<1> through SO_PASS<7> may be activated. Accordingly, all of the first and second pass transistors TR1 through TR7 and TR1' through TR7' included in each of the second through eighth page buffer units PBU1 through PBU7 may be turned on and connected in series. In this case, the second sensing node SO1 may be connected to the combined sensing node SOC via the third through eighth sensing nodes SO2 through SO7, and the data dumping operation may be performed between the main latch in the second page buffer unit PBU1 and a cache latch in the second cache unit CU1. In this case, because the first and second pass transistors TR0 and TR0' included in the first page buffer unit PBU0 are turned off, current consumption may be reduced. For example, the main latch in the second page buffer unit PBU1 and the cache latch in the second cache unit CU1 may be electrically connected to each other in response to the transistor NM7 (in FIG. 6) of the second cache unit CU1 being activated and at least one of the first through fourth transistors NM1 through NM4 (in FIG. 6) of the second page buffer unit PBU1 being activated.

In an eighth data transfer period 1128, the first through seventh pass control signals SO_PASS<0> through SO_PASS<6> may be deactivated, and only the eighth pass control signal SO_PASS<7> may be activated. Accordingly, the first and second pass transistors TR7 and TR7' included in the eighth page buffer unit PBU7 may be turned on and connected in series. In this case, the eighth sensing node SO7 may be connected to the combined sensing node SOC, and the data dumping operation may be performed between a main latch in the eighth page buffer unit PBU7 and a cache latch in the eighth cache unit CU7. In this case, because the first and second pass transistors TR0 through TR6 and TR0' through TR6' included in the first through seventh page buffer units PBU0 through PBU6 are turned off, current consumption may be reduced. For example, the main latch in the eighth page buffer unit PBU7 and the cache latch in the eighth cache unit CU7 may be electrically connected to each other in response to the transistor NM7 (in FIG. 6) of the eighth cache unit CU7 being activated and at least one of the first through fourth transistors NM1 through NM4 (in FIG. 6) of the eighth page buffer unit PBU7 being activated.

Figure 15:
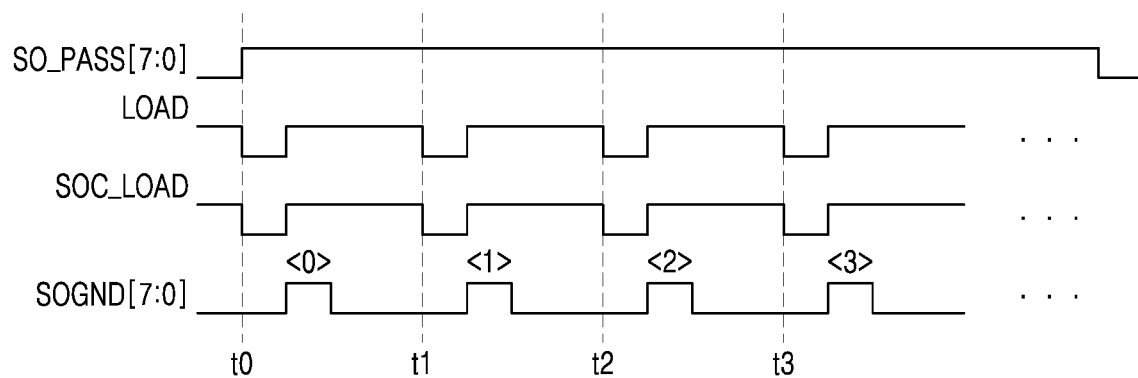
FIG. 15 is a timing diagram of an example of a data dumping operation of a page buffer circuit, according to an embodiment of the inventive concept.

FIG. 15 is a timing diagram of an example of the data dumping operation of the page buffer circuit 210a, according to an embodiment of the inventive concept. Referring to FIGS. 10 and 15 together, data transfer operations between the plurality of page buffer units PBU0 through PBU7 and the plurality of cache units CU0 through CU7 in the page buffer circuit 210a may be sequentially performed. During a period from a first time point t0 to a second time point t1, data may be dumped between the first page buffer unit PBU0 and the first cache unit CU0. At the first time point t0, the pass control signal SO_PASS[7:0] may transition to a logic high that is an enable level, and all of the first and second pass transistors TR0 through TR7 and TR0' through TR7' included in the first through eighth page buffer units PBU0 through PBU7 may be turned on. In an embodiment, the pass control signal SO_PASS[7:0] may maintain the logic high until the data dumping operation is completed between the first through eighth page buffer units PBU0 through PBU7 and the first through eighth cache units CU0 through CU7.

At the first time point t0, the load signal LOAD may transition to a logic low that is the enable level, and all of the precharge transistors PM0 through PM7 included in each of the first through eighth page buffer units PBU0 through PBU7 may be turned on, and the first through eighth sensing nodes SO0 through SO7 may be precharged to the precharge level. In addition, at the first time point t0, the combined sensing node load signal SOC_LOAD may transition to a logic low that is an enable level, the precharge transistor PMa included in the precharge circuit SOC_PRE may be turned on, and the combined sensing node (SOC) may be precharged to the precharge level. Next, the load signal LOAD and the combined sensing node load signal SOC_LOAD may transition to a logic high, and a first ground control signal SOGND<0> of a ground control signal SOGND[7:0] applied to the first page buffer unit PBU0 may be transition to the logic high that is the enable level. In this case, the first sensing node SO0 and the S-LATCH SL included in the first page buffer unit PBU0 may be electrically connected to each other, and data may be dumped between the S-LATCH SL included in the first page buffer unit PBU0 and the first cache unit CU0. Hereinafter, it will be described that the ground control signal SOGND [7:0] includes the first through eighth ground control signals SOGND<0> through SOGND<7> respectively corresponding to the first through eighth page buffer units PBU0 through PBU7.

During a period from the second time point t1 to a third time point t2, data may be dumped between the second page buffer unit PBU1 and the second cache unit CU1. At the second time point t1, the load signal LOAD and the combined sensing node load signal SOC_LOAD may transition to a logic low that is an enable level, and the first through eighth sensing nodes SO0 through SO7 and the combined sensing node SOC may be precharged to the precharge level. Next, the load signal LOAD and the combined sensing node load signal SOC_LOAD may be transitioned to a logic high, and a second ground control signal SOGND<1> of the ground control signal SOGND[7:0] applied to the second page buffer unit PBU1 may be transitioned to the logic high that is the enable level. In this case, the second sensing node SO1 and the S-LATCH SL included in the second page buffer unit PBU1 may be electrically connected to each other, and data may be dumped between the S-LATCH SL included in the second page buffer unit PBU1 and the second cache unit CU1. During a period from the third time point t2 to a fourth time point t3, data may be dumped between the third page buffer unit PBU2 and the third cache unit CU2, and during a period from the fourth time point t3 to a time point t4, data may be dumped between the fourth page buffer unit PBU3 and the fourth cache unit CU3.

Figure 16:
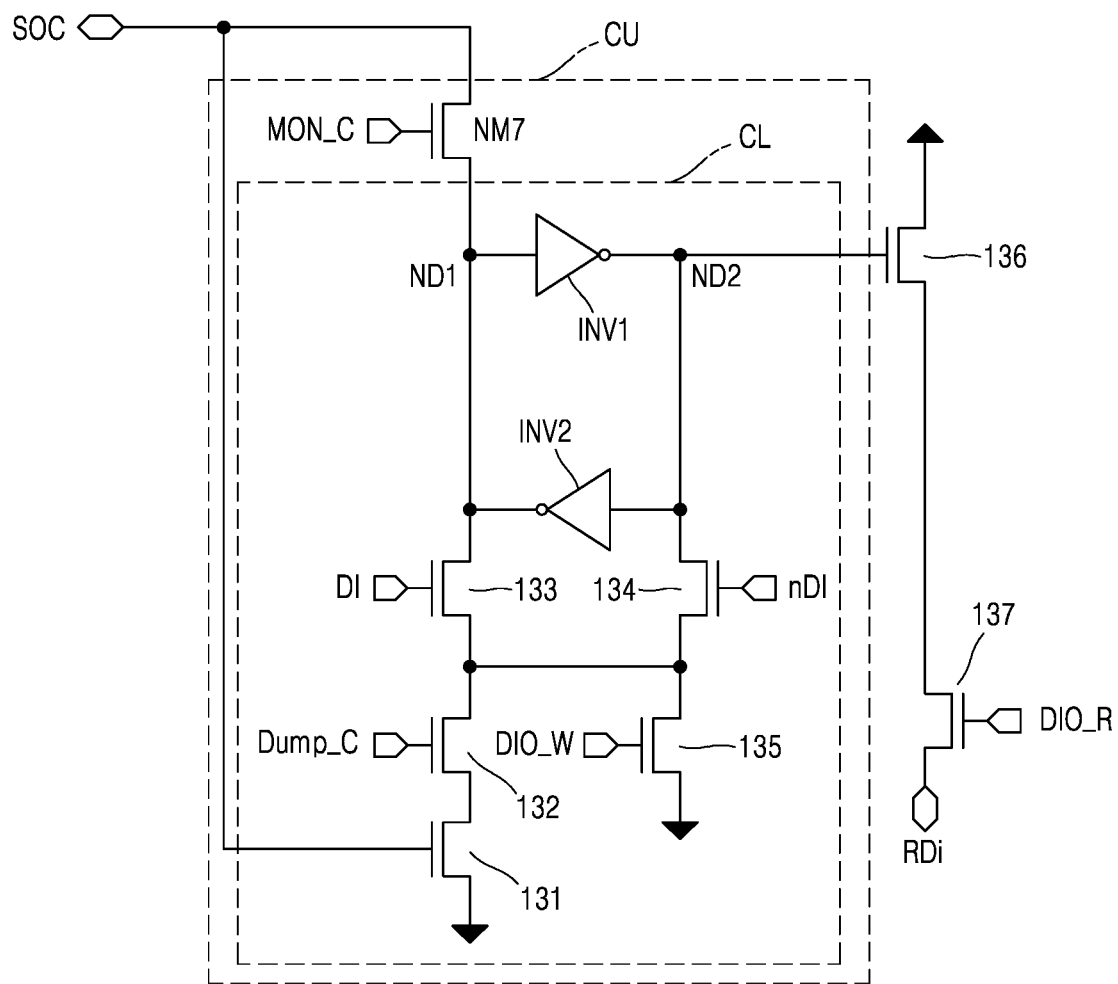
FIG. 16 is a circuit diagram of a cache unit according to an embodiment of the inventive concept.

FIG. 16 is a circuit diagram of the cache unit CU according to an embodiment of the inventive concept. Referring to FIGS. 6 and 16, the cache unit CU may include the monitor transistor NM7 and the C-LATCH CL, and the C-LATCH CL may include first and second inverters INV1 and INV2, a dump transistor 132, and transistors 131, 133 to 135. The monitor transistor NM7 may be driven according to the cache monitoring signal MON_C, and may control a connection between the combined sensing node SOC and the C-LATCH CL.

The first inverter INV1 may be connected between the first node ND1 and the second node ND2, the second inverter INV2 may be connected between the second node ND2 and the first node ND1, and thus, the first and second inverters INV1 and INV2 may form a latch. The transistor 131 may include a gate connected to the combined sensing node SOC. The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined according to the data signal DI and the data inversion signal nDI, respectively.

The cache unit CU may be connected to an input/output terminal RDi via transistors 136 and 137. The transistor 136 may include a gate connected to the second node ND, and may be turned on or off according to a voltage level of the second node ND2. The transistor 137 may be driven by a read control signal DIO_R. When the control signal DIO_R is activated and the transistor 137 is turned on, a voltage level of the input/output terminal RDi may be determined as '1' or '0' according to a state of the C-LATCH CL.

Figure 17:
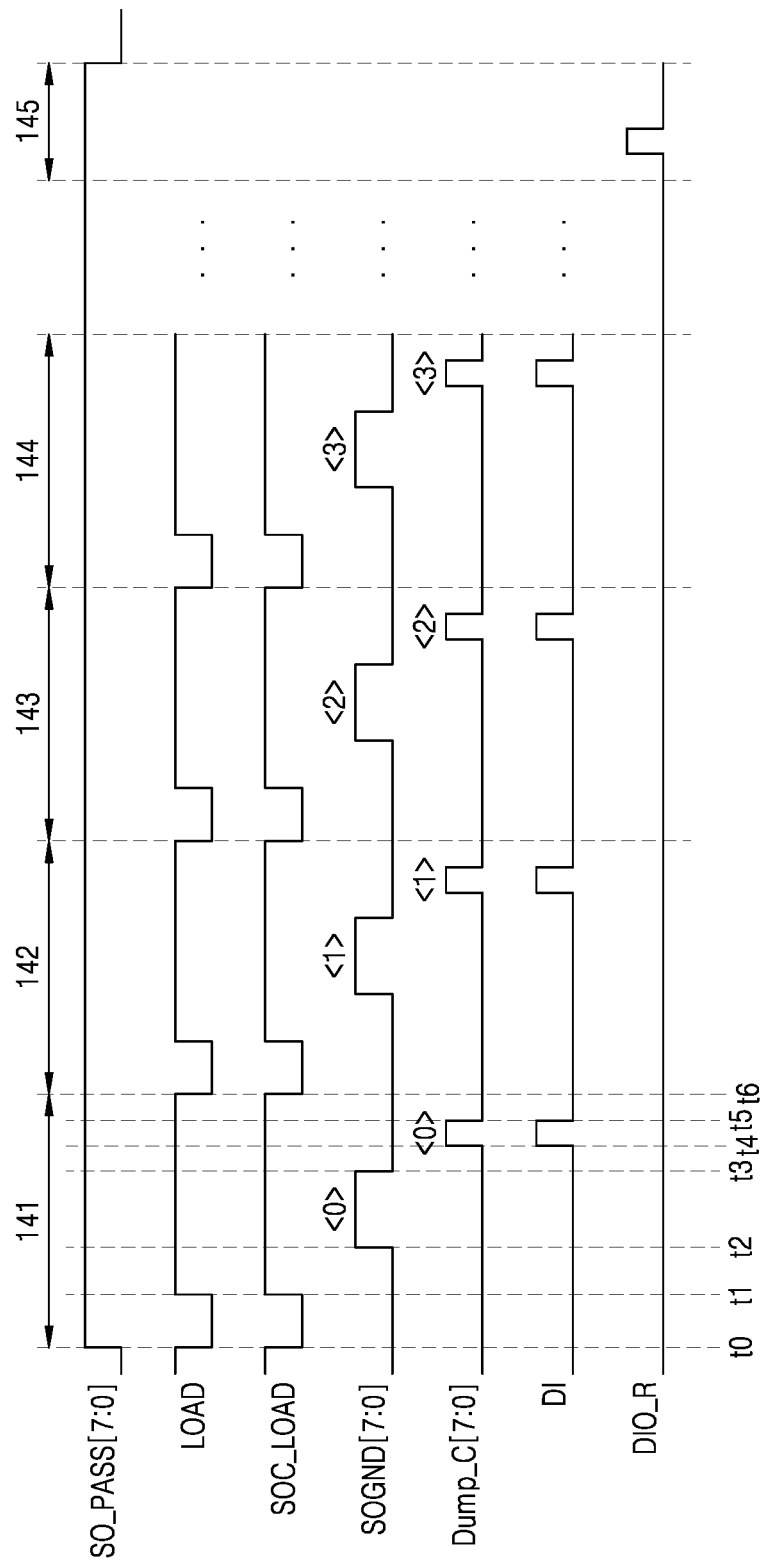
FIG. 17 is a timing diagram of an example of a data dumping operation of a page buffer circuit, according to an embodiment of the inventive concept.

FIG. 17 is a timing diagram of an example of the data dumping operation of the page buffer circuit 210a, according to an embodiment of the inventive concept. Referring to FIGS. 10, 16, and 17 together, during the data dumping operation of the page buffer circuit 210a, the pass control signal SO_PASS[7:0] may maintain a logic high that is an enable level, and all of the first and second pass transistors TR0 through TR7 and TR0' through TR7' may be turned on. Accordingly, the first through eighth sensing nodes SO0 through SG7 may be connected to the combined sensing node SOC, and may be connected to the first through eighth cache units CU0 through CU7 via the combined sensing node SOC. In first through fourth periods 141 through 144, data may be sequentially dumped between the first through fourth page buffer units (for example, PBU0 through PBU3 in FIG. 10) and the first through fourth cache units (for example, CU0 through CU3 in FIG. 10). In a fifth period 145, data stored in the first through eighth cache units CU0 through CU7 may be output via the data input/output line.

In the first period 141, the data dumping operation may be performed between the first page buffer unit PBU0 and the first cache unit CU0. The first period 141 may correspond to a period from the first time point t0 to a seventh time point t6, and hereinafter, the operation of the page buffer circuit 210a in the first period 141 will be described. The operation of the page buffer circuit 210a in the second through fourth periods 142 through 144 may correspond to the operation of the page buffer circuit 210a in the first period 141.

At a first time point t0, the load signal LOAD and the combined sensing node load signal SOC_LOAD may be transitioned to a logic low that is an enable level, and all of the precharge transistors PM0 through PM7 and PMa may be turned on, and the first through eighth sensing nodes SO0 through SO7 and the combined sensing node SOC may be precharged at a precharge level. At a second time point t1, the load signal LOAD and the combined sensing node load signal SOC_LOAD may be transitioned to a logic high that is a disable level. The period from the first time point t0 to the second time point t1 may be referred to as the precharge period.

At a third time point t2, the first ground control signal SOGND<0> applied to the first page buffer unit PBU0 may be transitioned to a logic high that is an enable level, and at a fourth time point t3, the first ground control signal SOGND<0> may be transitioned to a logic low. At a fifth time point t4, a first dump signal Dump_C<0> of a dump signal Dump_C[7:0] and the data signal DI applied to the first cache unit CU0 may be transitioned to a logic high that is an enable level. Hereinafter, it will be described that the dump signal Dump_C[7:0] includes the first through eighth dump signals Dump_C<0> through Dump_C<7> respectively corresponding to the first through eighth cache units CU0 through CU7. At a sixth time point t5, the first dump signal Dump_C<0> and the data signal DI may be transitioned to a logic low that is a disable level.

When the data dumping operation between the first through eighth page buffer units PBU0 through PBU7 and the first through eighth cache units CU0 through CU7 is completed, in the fifth period 145, the read control signal DIO_R may be activated to a logic high that is an enable level. Accordingly, data stored in each of the first through eighth cache units CU0 through CU7 may be output via the data input/output line.

Figure 18:
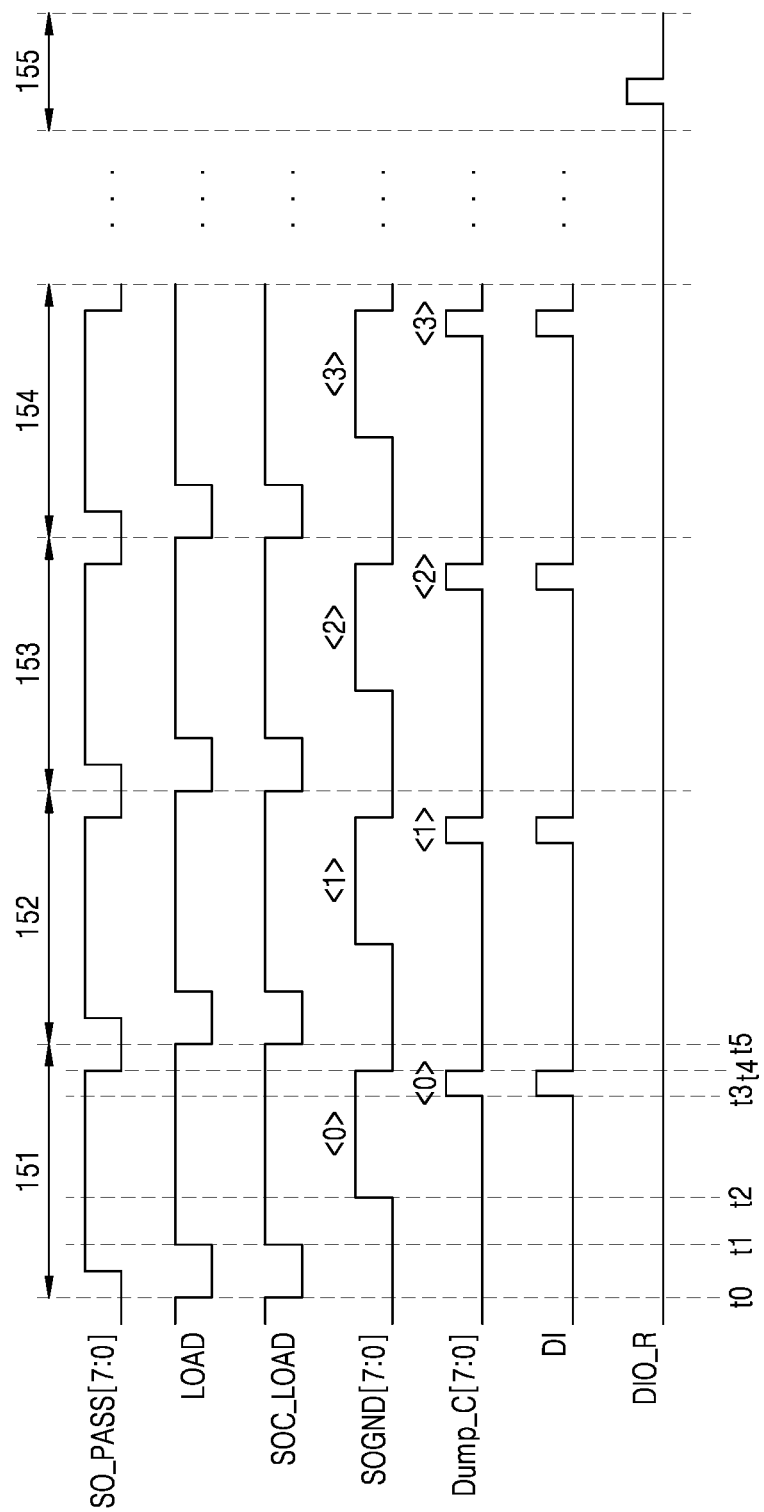
FIG. 18 is a timing diagram of an example of a data dumping operation of a page buffer circuit, according to an embodiment of the inventive concept.

FIG. 18 is a timing diagram of an example of a data dumping operation of the page buffer circuit 210a, according to an embodiment of the inventive concept. Referring to FIGS. 10, 16, and 18 together, the data dumping operation of the page buffer circuit 210a may include first through fifth periods 151 through 155. In first through fourth periods 151 through 154, data may be sequentially dumped between the first through fourth page buffer units (for example, PBU0 through PBU3 in FIG. 10) and the first through fourth cache units (for example, CU0 through CU3 in FIG. 10). In a fifth period 155, data stored in the first through eighth cache units CU0 through CU7 may be output via the data input/output line.

In the first period 151, the data dumping operation may be performed between the first page buffer unit PBU0 and the first cache unit CU0. The first period 151 may correspond to a period from a first time point t0 to a sixth time point t5, and hereinafter, the operation of the page buffer circuit 210a in the first period 151 will be described. The operation of the page buffer circuit 210a in the second through fourth periods 152 through 154 may correspond to the operation of the page buffer circuit 210a in the first period 151.

At a first time point t0, the load signal LOAD and the combined sensing node load signal SOC_LOAD may be transitioned to a logic low that is an enable level, and all of the precharge transistors PM0 through PM7 and PMa may be turned on, and the first through eighth sensing nodes SO0 through SO7 and the combined sensing node SOC may be precharged at a precharge level. Next, the pass control signal SO_PASS[7:0] may be transitioned to a logic high that is an enable level, and all of the first and second pass transistors TR0 through TR7 and TR0' through TR7' may be turned on. At a second time point t1, the load signal LOAD and the combined sensing node load signal SOC_LOAD may be transitioned to a logic high that is a disable level. The period from the first time point t0 to the second time point t1 may be referred to as the precharge period.

At a third time point t2, the first ground control signal SOGND<0> applied to the first page buffer unit PBU0 may be transitioned to a logic high that is an enable level, and at a fourth time point t3, the first dump signal Dump_C<0> and the data signal DI applied to the first cache unit CU0 may be transitioned to a logic high that is an enable level. At a fifth time point t4, the pass control signal SO_PASS[7:0], the first ground control signal SOGND<0>, the first dump signal Dump_C<0>, and the data signal DI may all be transitioned to a logic low that is a disable level.

When the data dumping operation between the first through eighth page buffer units PBU0 through PBU7 and the first through eighth cache units CU0 through CU7 is completed, in the fifth period 155, the read control signal DIO_R may be activated to a logic high that is an enable level. Accordingly, data stored in each of the first through eighth cache units CU0 through CU7 may be output via the data input/output line.

Figure 19:
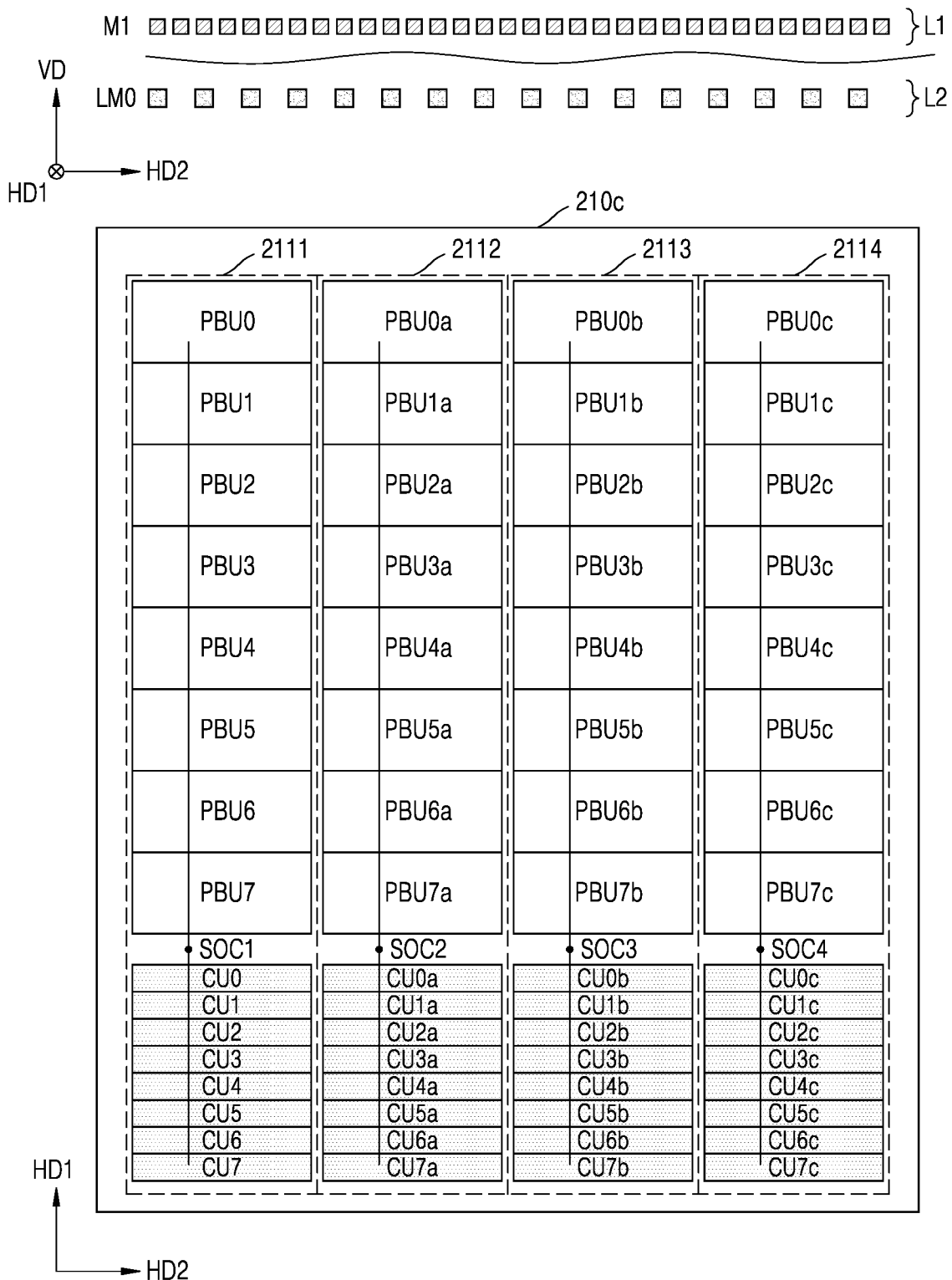
FIG. 19 illustrates an arrangement of page buffer units and cache units in a page buffer circuit, according to an embodiment of the inventive concept.

FIG. 19 illustrates an arrangement of the first through eighth page buffer units PBU0 through PBU7 and the first through eighth cache units CU0 through CU7 in the page buffer circuit 210c, according to an embodiment of the inventive concept. Referring to FIGS. 2 and 19 together, the first semiconductor layer L1 may include the first metal layer M1 extending in the first horizontal direction HD1, and the plurality of bit lines BL may be implemented as the first metal layer M1. The second semiconductor layer L2 may include the first lower metal layer LM0 extending in the first horizontal direction HD1. In this case, in the second horizontal direction HD2, the pitch of the first lower metal layer LM0 may be greater than the pitch of the first metal layer M1. For example, the pitch of the first lower metal layer LM0 may be approximately twice the pitch of the first metal layer M1.

The second semiconductor layer L2 may include the page buffer circuit 210c, and the page buffer circuit 210c may be implemented in a form of a page buffer array including a plurality of columns 2111 through 2114 in the second horizontal direction HD2. Each of the plurality of columns 2111 through 2114 may include first through eighth page buffer units PBU0 through PBU7 and the first through eighth cache units CU0 through CU7. For example, the configuration of each of the plurality of columns 2111 through 2114 may correspond to the page buffer circuit 210a illustrated in FIGS. 9 and 10 or the page buffer circuit 210b illustrated in FIGS. 12 and 13, and accordingly, the contents described above with reference to FIGS. 9 through 18 may also be applied to the present embodiment. As a width of a transistor decreases, and a size of the first through eighth page buffer units PBU0 through PBU7 in the second horizontal direction HD2 decrease, the page buffer circuit 210c may arrange more page buffer units in the same row, and accordingly, the page buffer circuit 210c may include a plurality of columns 2111 through 2114.

The first column 2111 may include a first main region and a first cache region in the first horizontal direction HID1, the first through eighth page buffer units PBU0 through PBU7 may be in the first main region, and the first through eighth cache units CU0 through CU7 may be in the first cache region. The second column 2112 may include a second main region and a second cache region in the first horizontal direction HD1, first through eighth page buffer units PBU0a through PBU7a may be in the second main region, and first through eighth cache units CU0a through CU7a may be in the second cache region. The third column 2113 may include a third main region and a third cache region in the first horizontal direction HD1, first through eighth page buffer units PBU0b through PBU7b may be in the third main region, and first through eighth cache units CU0b through CU7b may be in the third cache region. The fourth column 2114 may include a fourth main region and a fourth cache region in the first horizontal direction HD1, first through eighth page buffer units PBU0c through PBU7c may be in the fourth main region, and first through eighth cache units CU0c through CU7c may be in the fourth cache region.

In the first column 2111, sensing nodes of each of the first through eighth page buffer units PBU0 through PBU7 may be commonly connected to a first combined sensing node SOC1, and the first to eighth cache units CU0 to CU7 may be commonly connected to the first combined sensing node SOC1. In the second column 2112, sensing nodes of each of the first through eighth page buffer units PBU0a through PBU7a may be commonly connected to a second combined sensing node SOC2, and the first to eighth cache units CU0a through CU7a may be commonly connected to the second combined sensing node SOC2. In the third column 2113, sensing nodes of each of the first through eighth page buffer units PBU0b through PBU7b may be commonly connected to a third combined sensing node SOC3, and the first to eighth cache units CU0b through CU7b may be commonly connected to the third combined sensing node SOC3. In the fourth column 2114, sensing nodes of each of the first through eighth page buffer units PBU0c through PBU7c may be commonly connected to a fourth combined sensing node SOC4, and the first to eighth cache units CU0c through CU7c may be commonly connected to the fourth combined sensing node SOC4.

Figure 20:
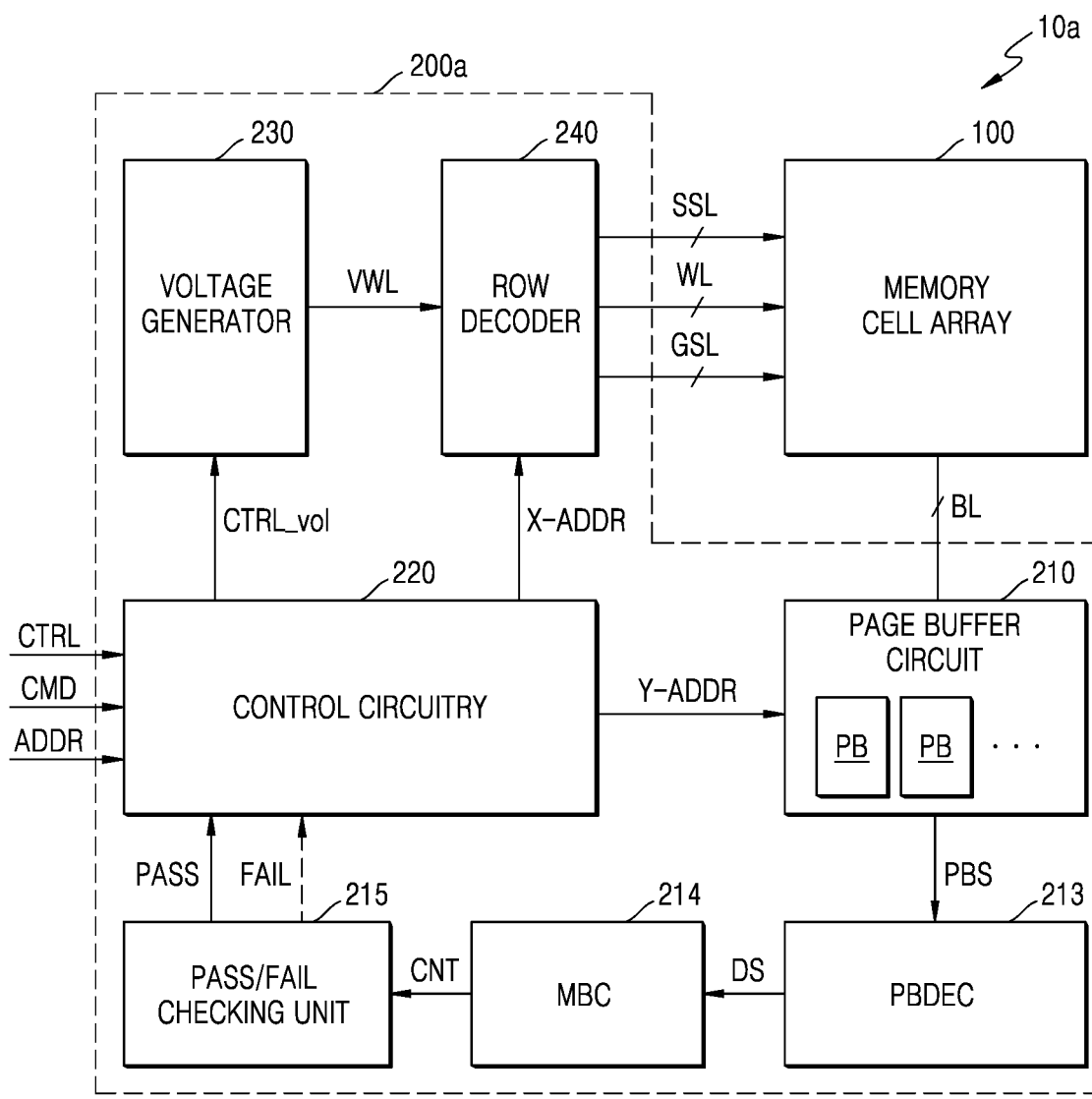
FIG. 20 is a block diagram of a memory device according to an embodiment of the inventive concept.

FIG. 20 is a block diagram of a memory device 10a according to an embodiment of the inventive concept. Referring to FIG. 20, the memory device 10a may include the memory cell array 100 and a periphery circuit 200a. The memory device 10a may correspond to a modified example of the memory device 10 of FIG. 1, and descriptions given with reference to FIGS. 1 through 19 may also be applied to the present embodiment. Compared with the memory device 10 of FIG. 1, the periphery circuit 200a may further include a page buffer decoder (PBDEC) 213, a mass bit counter (MBC) 214, and a pass/fail checking unit 215.

The PBDEC 213 may generate a decoder output signal DS corresponding to the number of failed bits by using a page buffer signal PBS received from the page buffer circuit 210. For example, when the page buffer signal PBS is a logic low, a program for the corresponding memory cell MC may be determined as being failed and data programmed to the corresponding memory cell MC may be determined as a failed bit. The PBDEC 213 may receive a reference current from a current generator (not illustrated), and generate the decoder output signal DS based on the received reference current.

The MBC 214 may receive the decoder output signal DS from the PBDEC 213, and generate a count result CNT from the decoder output signal DS. For example, the MBC 214 may include an analog-to-digital converter that converts the decoder output signal DS of an analog-level to the count result CNT that is a digital value. The MBC 214 may receive a reference current from a current generator (not illustrated), and generate the count result CNT based on the received reference current.

The pass/fail checking unit 215 may receive the count result CNT from the MBC 214, generate a pass signal PASS or fail signal FAIL based on the count result CNT, and provide the generated pass signal PASS or fail signal FAIL to the control circuitry 220. For example, when the count result CNT is less than or equal to the reference number, the pass/fail checking unit 215 may generate the pass signal PASS. For example, when the count result CNT is greater than the reference number, the pass/fail checking unit 215 may generate the fail signal FAIL.

Figure 21:
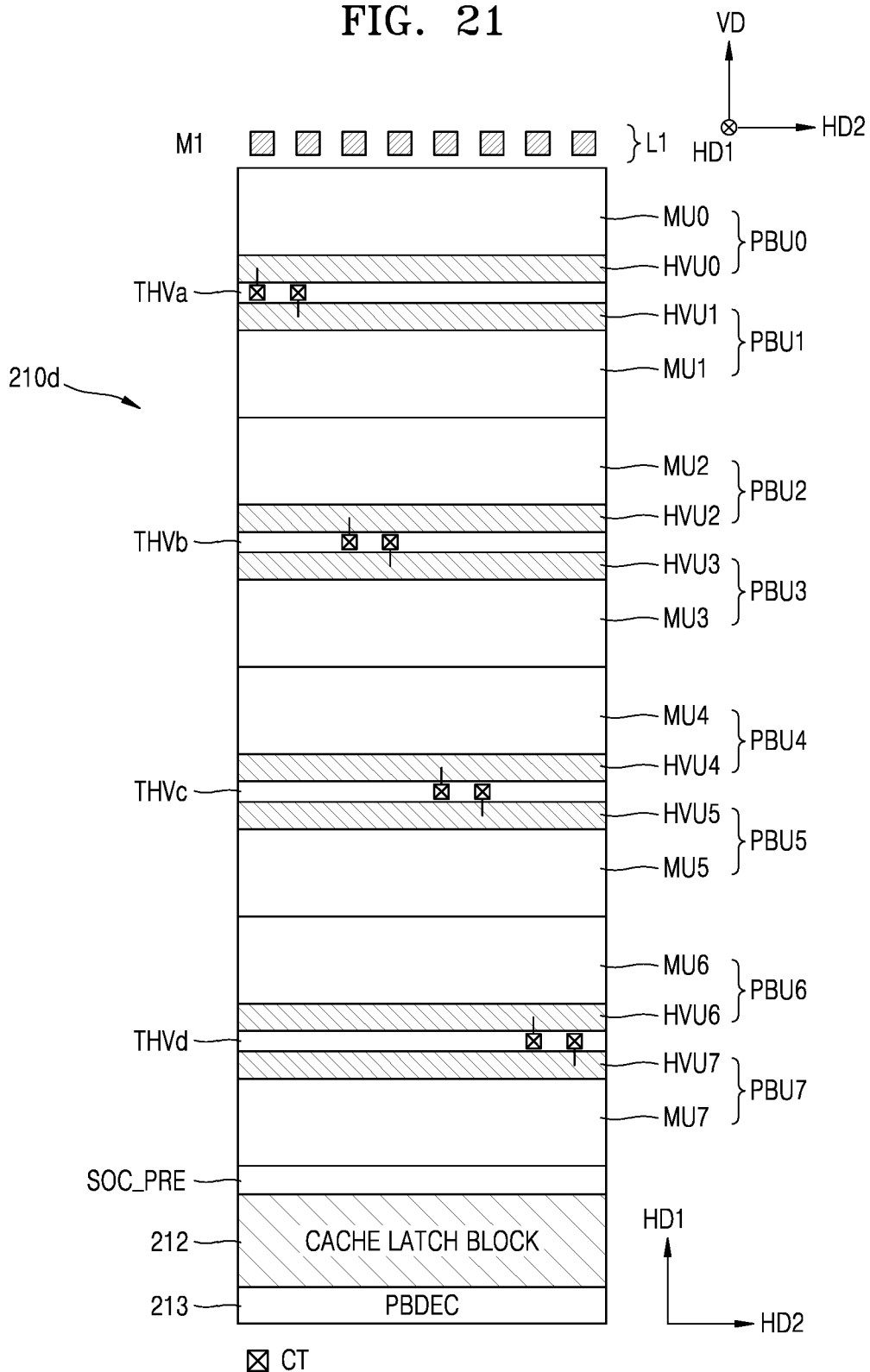
FIG. 21 is a plan view of a page buffer circuit and a page buffer decoder, according to an embodiment of the inventive concept.

FIG. 21 is a plan view of a page buffer circuit 210d and the page buffer decoder (PBDEC) 213, according to an embodiment of the inventive concept. Referring to FIGS. 2 and 21 together, the first semiconductor layer L1 may include first through eighth bit lines BL1 through BL8 extending in the first horizontal direction HD1, and the first through eighth bit lines BL0 through BL7 may be implemented as a first metal layer M1. In an embodiment, a size of the page buffer circuit 210d in the second horizontal direction HD2 may correspond to an arrangement area of the first through eighth bit lines BL0 through BL7, and accordingly, the page buffer circuit 210d may include page buffers of eight stages. The page buffer circuit 210d may correspond to a modified example of the page buffer circuit 210a illustrated in FIGS. 9 and 10 or the page buffer circuit 210b illustrated in FIGS. 12 and 13, and descriptions given with reference to FIGS. 9 through 20 may also be applied to the present embodiment.

The page buffer circuit 210d may include the first through eighth page buffer units PBU0 through PBU7 in the first horizontal direction HD1, and each of the first through eighth page buffer units PBU0 through PBU7 may include a main unit and a high voltage unit. For example, the first page buffer unit PBU0 may include a first main unit MU0 and a first high voltage unit HVU0 in the first horizontal direction HD1.

The page buffer circuit 210d may further include a plurality of contact regions THVa through THVd. For example, the first contact region THVa may be between the first page buffer unit PBU0 and the second page buffer unit PBU1, and in the first contact region THVa, the first bit line contact CT0 connected to the first bit line BL0 and a second bit line contact CT1 connected to the second bit line BL1 may be arranged. The first bit line contact CT0 may be connected to a high voltage transistor included in the first high voltage unit HVU0 (for example, TR_hv in FIG. 6), and the second bit line contact CT1 may be connected to a high voltage transistor included in a second high voltage unit HVU1.

The page buffer circuit 210d may further include a cache latch block 212, and the cache latch block 212 may include first through eighth cache latches (for example, CL0 through CL7 in FIG. 5) respectively corresponding to the first through eighth page buffer units PBU0 through PBU7. The page buffer circuit 210d may further include the precharge circuit SOC_PRE between the eighth page buffer unit PBU7 and the cache latch block 212.

In addition, the PBDEC 213 may be adjacent to the page buffer circuit 210d in the first horizontal direction HD1. The PBDEC 213 may determine the number of pass cells or pass bits and failed cells or failed bits during the program verification operation. For example, the PBDEC 213 may include a plurality of transistors connected between the cache latches and global data lines. In an embodiment, when the data dumping operation is performed from the S-LATCHs SL of each of the first through eighth page buffer units PBU0 through PBU7 to the PBDEC 213, the pass control signals SO_PASS[7:0] may be activated, and the first and second pass transistors may be turned on. Accordingly, the sensing node lines and the combined sensing node lines may be used as data transfer lines, and the data dumping operation may be sequentially performed between the S-LATCHs SL of the first through eighth page buffer units PBU0 through PBU7 and the PBDEC 213.

Figure 22:
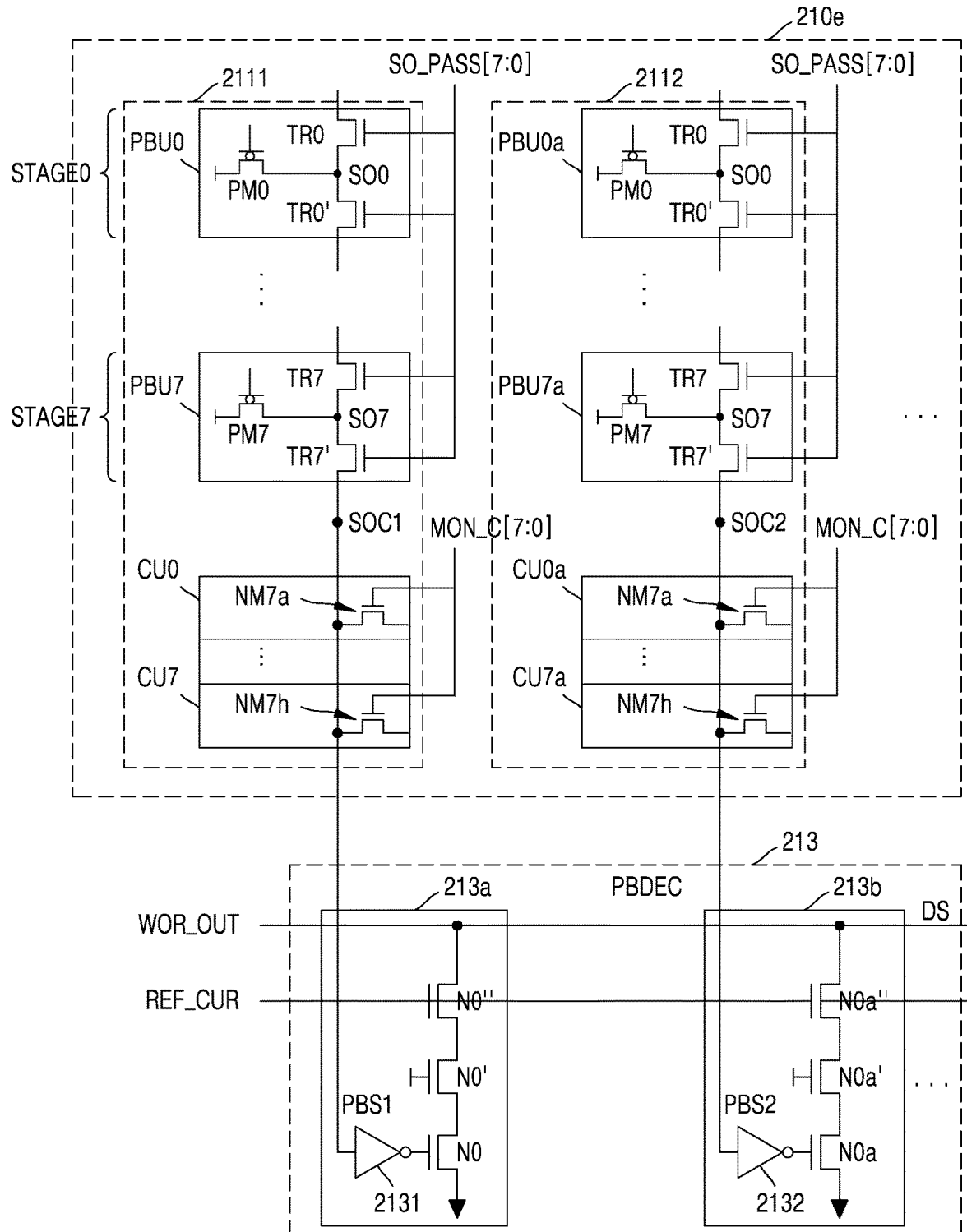
FIG. 22 illustrates a page buffer circuit and a page buffer decoder, according to an embodiment of the inventive concept.

FIG. 22 illustrates a page buffer circuit 210e and the PBDEC 213, according to an embodiment of the inventive concept. Referring to FIG. 22, the page buffer circuit 210e may have a multi-stage structure in which a plurality of page buffers are in the first horizontal direction HD1, for example, an 8-stage structure including first through eighth stages STAGE0 through STAGE7. In addition, in the page buffer circuit 210e, a plurality of columns including first and second columns 2111 and 2112 may be in the second horizontal direction HD2.

The PBDEC 213 may include a plurality of page buffer decoders including first and second PBDECs 213a and 213b respectively connected to the first and second columns 2111 and 2112 included in the page buffer circuit 210e. The first PBDEC 213a may include an inverter 2131 and serially-connected transistors N0, N0', and N0", and the second PBDEC 213b may include an inverter 2132 and serially-connected transistors N0a, N0a', and N0a". Each of the inverters 2131 and 2132 may receive a page buffer signal from a corresponding column, and a reference current signal REF_CUR may be applied to a gate of each of the transistors N0" and N0a".

For example, the first and second PBDECs 213a and 213b may receive first and second page buffer signals PBS1 and PBS2 from the page buffer units PBU0 and PBU0a included in the first stage STAGE0, respectively. For example, when a memory cell MC connected to the page buffer unit PBU0 is determined as a program failed cell, a logic low may be stored in the S-LATCH SL of the page buffer unit PBU0. In this case, the first page buffer signal PBS1 may be a logic low that is a voltage level of the first sensing node SO0, and the voltage level of the first combined sensing node SOC1 may also be a logic low. In this case, the inverter 2131 may output a logic high signal, and accordingly, the transistor N0 may be turned on, and then, the first PBDEC 213a may operate as a current sink.

The transistor N0" may output a first signal, that is, a reference current, to a wired OR terminal WOR_OUT based on the reference current signal REF_CUR. In this case, the reference current may correspond to a current flowing through the transistor N0" when the transistor N0" is turned on according to the reference current signal REF_CUR. Similarly, the transistor N0a" may output a second signal, that is, a reference current, to the wired OR terminal WOR_OUT based on the reference current signal REF_CUR. The wired OR terminal WOR_OUT may be commonly connected to the first and second PBDECs 213a and 213b, and accordingly, the first and second signals output from the first and second PBDECs 213a and 213b may be accumulated in the wired OR terminal WOR_OUT and generated as the decoder output signal DS. For example, the decoder output signal DS may correspond to a current signal $I_{WOR}$ flowing through the wired OR terminal WOR_OUT.

Figure 23:
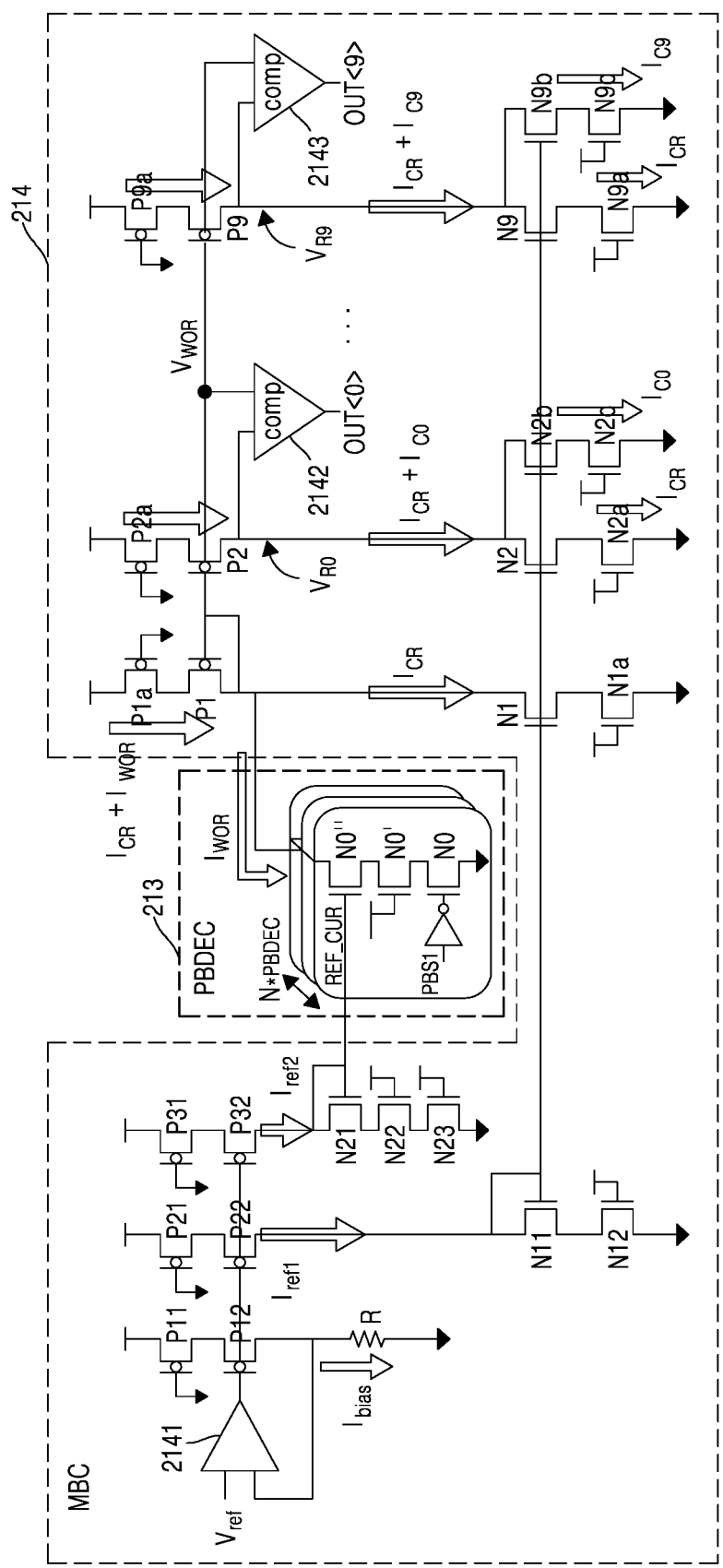
FIG. 23 illustrates a page buffer decoder and a mass bit counter, according to an embodiment of the inventive concept.

FIG. 23 illustrates the PBDEC 213 and a MBC 214, according to an embodiment of the inventive concept. Referring to FIGS. 20, 22, and 23 together, the PBDEC 213 may include N PBDECs. In this case, N is a positive integer, and may correspond to the number of columns included in a page buffer circuit. For example, the first PBDEC 213a may include the inverter 2131 and the transistors N0, N0', and N0", and the transistor N0' may be referred to as a column enable transistor. The MBC 214 may be connected to the wired OR terminal WOR_OUT connected to the N PBDECs.

The MBC 214 may generate the counting results CNT corresponding to the number of failed bits, that is, OUT<0> through OUT<9>, from the decoder output signal DS of an analog level, that is, the current signal $I_{WOR}$. The MBC 214 may include a plurality of transistors P11, P12, P21, P22, P31, P32, N11, N12, N21, N22, and N23 constituting a reference current generator, a resistor R, and a differential amplifier 2141. In addition, the MBC 214 may further include transistors P1, P1a, P2, P2a, P9, P9a, N1, N1a, N2, N2a, N2b, N2c, N9, N9a, and N9b, and N9c constituting the counting unit, and a plurality of comparators 2142 and 2143. In an embodiment, a period in which the operation of the MBC 214 is enabled, transistors P11, P21, P31, N12, N23, P1a, P2a, P9a, N1a, N2a, N2c, N9a, and N9c may be turned on. In an embodiment, in a period in which the operation of the MBC 214 is disabled, the transistors P11, P21, P31, N12, N23, P1a, P2a, P9a, N1a, N2a, N2c, N9a, and N9c may be turned off.

A reference voltage $V_{ref}$ may be input to a first input terminal of the differential amplifier 2141, and a voltage across the resistor R may be input to a second input terminal. The transistors P11 and P12 and the resistor R may constitute a feedback variable resistor unit, and a bias current $I_{bias}$ may flow through the resistor R. The transistors P21, P22, N11, and N12 may constitute a first reference current generator that generates a first reference current $I_{ref1}$, and the transistors P31, P32, N21, N22, and N23 may constitute a second reference current generator that generates a second reference current Iren. A node voltage between the transistors P32 and N21 in the second reference current generator may be provided as a reference current signal REF_CUR to the PBDEC 213.

Figure 24:
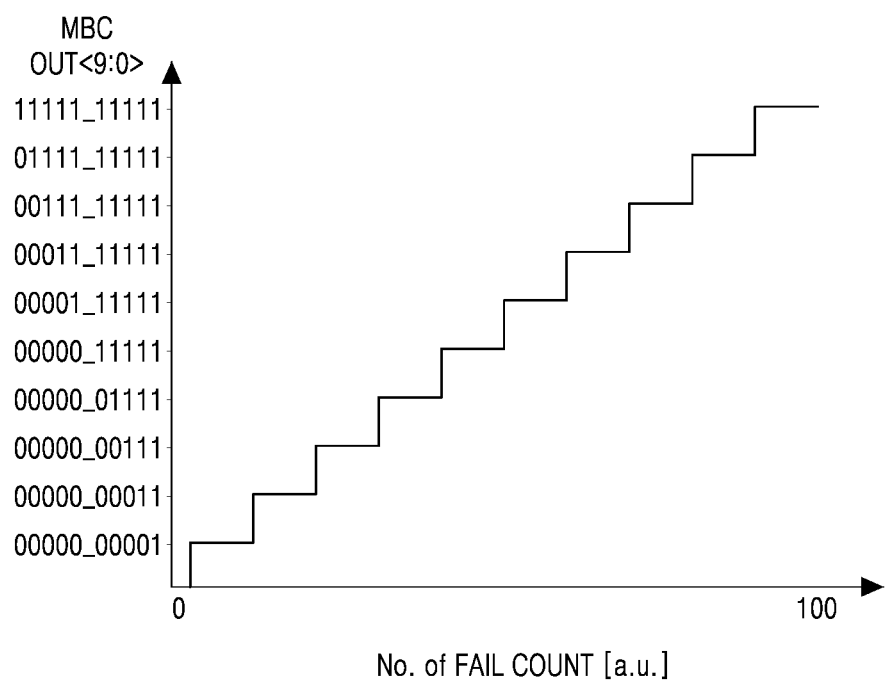
FIG. 24 is a graph of a digital output signal of a mass bit counter, according to an embodiment of the inventive concept.

FIG. 24 is a graph of a digital output signal OUT<9:0> of the MBC 214, according to an embodiment of the inventive concept. Referring to FIGS. 22 through 24 together, the transistors P1 and P2 may form a current mirror, and a current flowing through the transistor P1 may correspond to a sum of the current signal $I_{WOR}$ flowing through the wired OR terminal WOR_OUT and a current signal $I_{CR}$ flowing through the transistor N1. The comparator 2142 may output the comparison result OUT<0>, by comparing a voltage $V_{WOR}$ of the wired OR terminal WOR_OUT with a node voltage $V_{R0}$ between the transistors P2 and N2. Similarly, the comparator 2143 may output the comparison result OUT<9>, by comparing the voltage $V_{WOR}$ of the wired OR terminal WOR_OUT with a node voltage $V_{R9}$ between the transistors P9 and N9. As the number of fail counts in the page buffer circuit 210e increases, the digital output signals OUT<9:0> of the MBC 214 may increase. In this manner, the MBC 214 may use the comparators 2142 and 2143, and generate the digital output signal OUT<9:0> from the current signal $I_{WOR}$ output from the PBDEC 213.

Figure 25:
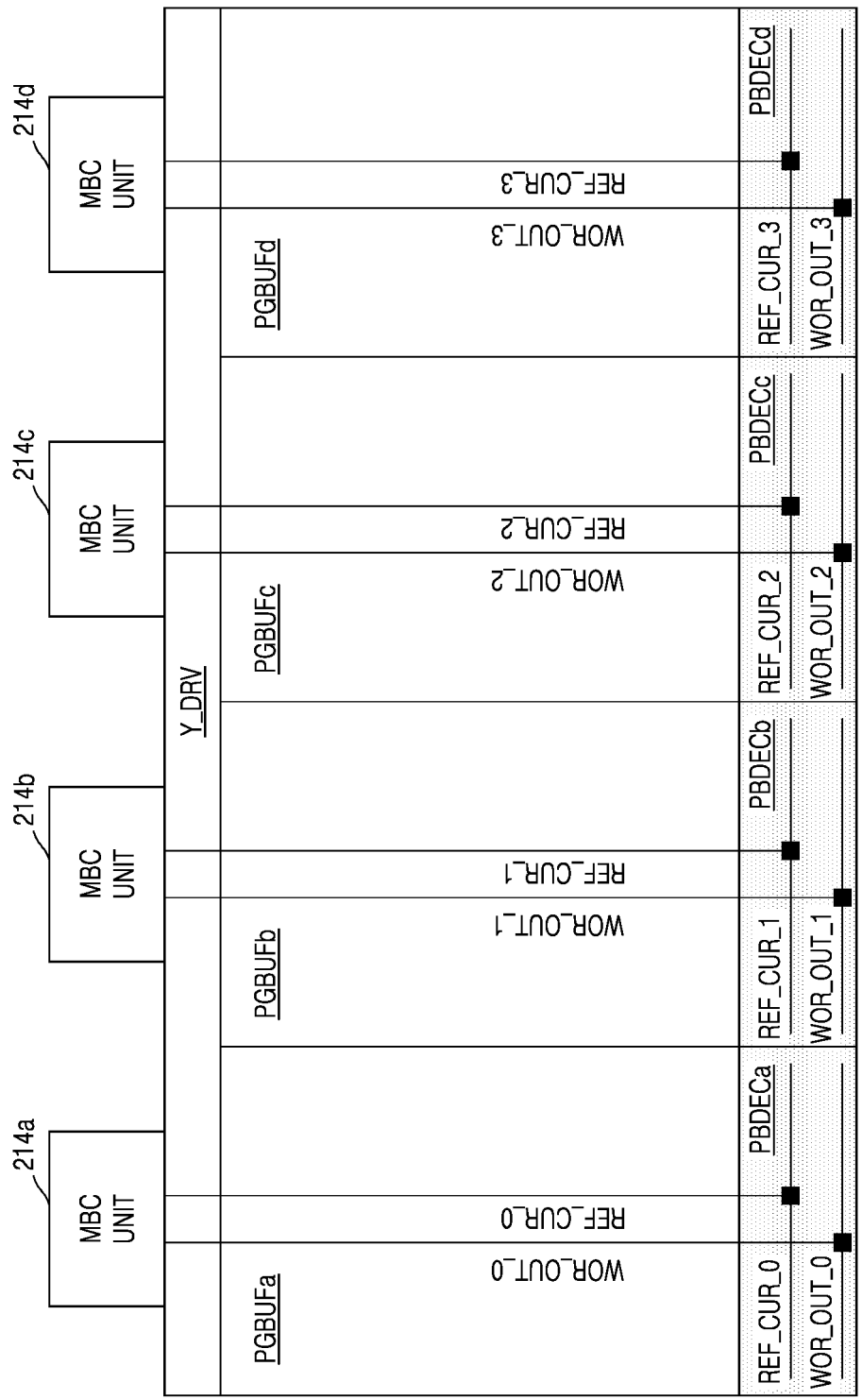
FIG. 25 illustrates a plurality of page buffers according to an embodiment of the inventive concept.

FIG. 25 illustrates a plurality of page buffers PGBUFa through PGBUFd according to an embodiment of the inventive concept. Referring to FIG. 25, the plurality of page buffers PGBUFa to PGBUFd may be adjacent to each other in the second horizontal direction HD2. For example, each of the plurality of page buffers PGBUFa through PGBUFd may correspond to the page buffer circuit 210e in FIG. 22, and accordingly, may include a plurality of PBUs and a plurality of CUs, that are adjacent to each other in the first horizontal direction HD1. The plurality of page buffers PGBUFa through PGBUFd may be connected to a column driver Y_DRV.

The plurality of PBDECs PBDECa through PBDECd may be provided to correspond to the plurality of page buffers PGBUFa through PGBUFd, respectively. For example, the page buffer PGBUFa and the PBDEC PBDECa corresponding to each other may be adjacent to each other in the first horizontal direction HD1. The plurality of MBC units 214a through 214d may be provided to correspond to the plurality of PBDECs PBDECa through PBDECd, respectively. For example, a wired OR terminal WOR_OUT_0 and a reference current signal terminal REF_CUR_0 of the PBDEC PBDECa may be connected to the MBC unit 214a.

Figure 26:
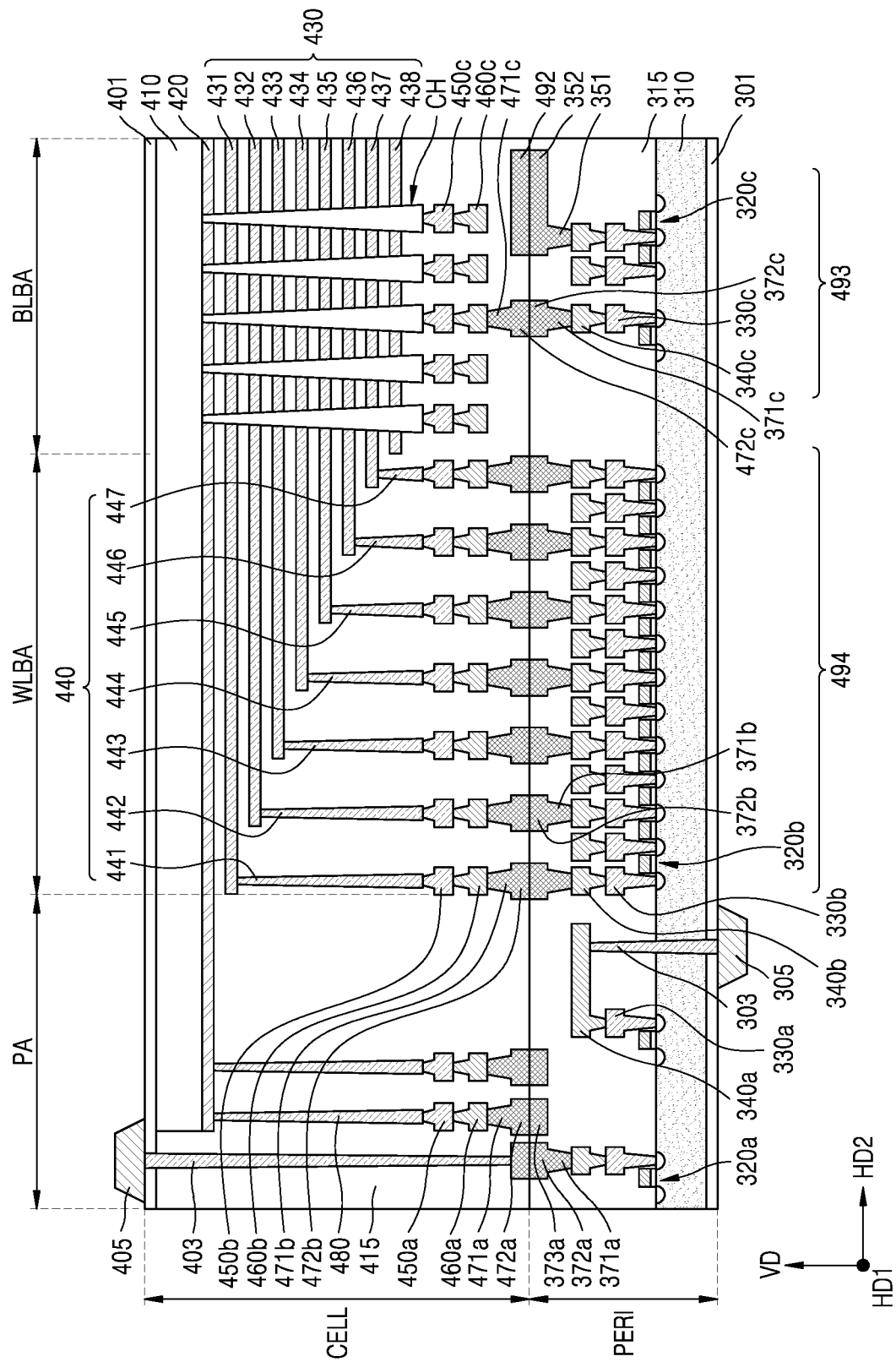
FIG. 26 is a cross-sectional view of a memory device according to an embodiment of the inventive concept.

FIG. 26 is a cross-sectional view of a memory device 500 according to an embodiment of the inventive concept. Referring to FIG. 26, the memory device 500 may have a chip to chip (C2C) structure. The C2C structure may mean a structure in which, after an upper chip including a cell region CELL (also referred to as a memory cell region CELL) is manufactured on a first wafer, and a lower chip including a periphery circuit region PERI is manufactured on a second wafer different from the first wafer, the upper chip and the lower chip are connected to each other by using a bonding method. For example, the bonding method may mean a method of electrically connecting a bonding metal formed on an uppermost metal layer of an upper chip to a bonding metal formed on an uppermost metal layer of a lower chip. For example, when the bonding metal includes copper (Cu), the bonding method may be a Cu—Cu bonding method, and the bonding metal may also include aluminum or tungsten.

Each of the periphery circuit region PERI and the cell region CELL of the memory device 500 may include an external pad bonding area PA, a word line bonding area WLBA, and a bit line bonding area BLBA. The periphery circuit region PERI may include a first substrate 310, an interlayer insulating layer 315, a plurality of circuit elements 320a, 320b, and 320c formed on the first substrate 310, and first metal layer 330a, 330b, and 330c respectively connected to each of the plurality of circuit elements 320a, 320b, and 320c, and second metal layer 340a, 340b, and 340c respectively formed on the first metal layers 330a, 330b, and 330c. Each of the circuit elements 320a, 320b, and 320c may include one or more transistors. In an embodiment, the first metal layers 330a, 330b, and 330c may include tungsten having relatively high resistance, and the second metal layers 340a, 340b, and 340c may include Cu having relatively low resistance.

In the present specification, only the first metal layers 330a, 330b, and 330c and the second metal layers 340a, 340b, and 340c are illustrated and described, but the invention is not limited thereto, and at least one or more metal layers may be further formed on the second metal layers 340a, 340b, and 340c. At least some of the one or more metal layers formed on the second metal layers 340a, 340b, and 340c may include aluminum or the like having a lower resistance than Cu forming the second metal layers 340a, 340b, and 340c.

The interlayer insulating layer 315 may be on the first substrate 310 to cover the plurality of circuit elements 320a, 320b, and 320c, the first metal layers 330a, 330b, and 330c, and the second metal layers 340a, 340b, and 340c, and may include an insulating material such as silicon oxide and silicon nitride.

Lower bonding metals 371b and 372b may be formed on the second metal layer 340b of the word line bonding area WLBA. In the word line bonding area WLBA, the lower bonding metals 371b and 372b of the periphery circuit region PERI may be electrically connected to upper bonding metals 471b and 472b of the cell region CELL by the bonding method, and the lower bonding metals 371b and 372b and the upper bonding metals 471b and 472b may include aluminum, copper, tungsten, etc. The upper bonding metals 471b and 472b of the cell region CELL may be referred to as first metal pads, and the lower bonding metals 371b and 372b of the periphery circuit region PERI may be referred to as second metal pads.

The cell region CELL may provide at least one memory block. The cell region CELL may include a second substrate 410 and a common source line 420. On the second substrate 410, a plurality of word lines 431 through 438 (i.e., word lines 430) may be stacked in the direction VD perpendicular to an upper surface of the second substrate 410. String select lines and ground select lines may be on and under the word lines 430, and the word lines 430 may be between the string select lines and the ground select line.

In the bit line bonding area BLBA, a channel structure CH may extend in a direction perpendicular to an upper surface of the second substrate 410 and penetrate the word lines 430, the string select lines, and the ground select line. The channel structure CH may include a data storage layer, a channel layer, and a filled insulating layer, and the channel layer may be electrically connected to a first metal layer 450c and a second metal layer 460c. For example, the first metal layer 450c may be a bit line contact, and the second metal layer 460c may be a bit line BL. In an embodiment, the second metal layer 460c, that is, the bit line BL may extend in the first horizontal direction HD1 parallel with the upper surface of the second substrate 410.

In the embodiment illustrated in FIG. 26, an area in which the channel structure CH and the second metal layer 460c, that is, the bit line BL are arranged may be defined as the bit line bonding area BLBA. The second metal layer 460c, that is, the bit line BL may be electrically connected to the circuit elements 320c providing a page buffer 493 in the periphery circuit region PERI in the bit line bonding area BLBA. For example, the second metal layer 460c, that is, the bit line BL may be connected to an upper bonding metals 471c and 472c in the cell region CELL, and the upper bonding metals 471c and 472c may be connected to lower bonding metals 371c and 372c connected to the circuit elements 320c of the page buffer 493.

In the word line bonding area WLBA, the word lines WL 430 may extend in the second horizontal direction HD2 parallel with the upper surface of the second substrate 410, and may be connected to a plurality of cell contact plugs 441 through 447 and 440. The word lines WL 430 and the cell contact plugs 440 may be connected to each other by using pads extending at least some of the word lines WL 430 to different lengths from each other in the second horizontal direction HD2. A first metal layer 450b and a second metal layer 460b may be sequentially connected to an upper portion of the cell contact plugs 440 connected to the word lines WL 430. The cell contact plugs 440 may be connected to the periphery circuit region PERI via the upper bonding metals 471b and 472b of the cell region CELL in the word line bonding area WLBA and the lower bonding metals 371b and 372b of the periphery circuit region PERI.

The cell contact plugs 440 may be electrically connected to the circuit elements 320b providing a row decoder 494 in the periphery circuit region PERI. In an embodiment, an operating voltage of the circuit elements 320b constituting the row decoder 494 may be different from an operating voltage of the circuit elements 320c constituting the page buffer 493. For example, the operating voltage of the circuit elements 320c constituting the page buffer 493 may be greater than the operating voltage of the circuit elements 320b constituting the row decoder 494.

A common source line contact plug 480 may be in the external pad bonding area PA. The common source line contact plug 480 may include a conductive material such as a metal, a metal compound, polysilicon, or the like, and may be electrically connected to the common source line 420. A first metal layer 450a and a second metal layer 460a may be sequentially stacked on the common source line contact plug 480. For example, an area in which the common source line contact plug 480, the first metal layer 450a, and the second metal layer 460a are arranged may be defined as the external pad bonding area PA.

First and second input/output pads 305 and 405 may be in the external pad bonding area PA. Referring to FIG. 26, a lower insulating layer 301 covering a lower surface of the first substrate 310 may be formed under the first substrate 310, and the first input/output pad 305 may be formed on the lower insulating layer 301. The first input/output pad 305 may be connected to at least one of the plurality of circuit elements 320a, 320b, and 320c in the periphery circuit region PERI via a first input/output contact plug 303, and may be apart from the first substrate 310 by a lower insulating layer 301. In addition, a side insulating layer may be between the first input/output contact plug 303 and the first substrate 310, and may electrically separate the first input/output contact plug 303 from the first substrate 310.

Referring to FIG. 26, an upper insulating layer 401 covering an upper surface of the second substrate 410 may be formed on the second substrate 410, and a second input/output pad 405 may be formed on an upper insulating layer 401. The second input/output pad 405 may be connected to at least one of the plurality of circuit elements 320a, 320b, and 320c in the periphery circuit region PERI via the second input/output contact plug 403. In the example embodiment, the second input/output pad 405 is electrically connected to a circuit element 320a.

According to embodiments, the second substrate 410, the common source line 420, or the like may not be in an area where the second input/output contact plug 403 is arranged. In addition, the second input/output pad 405 may not overlap the word lines WL 430 in a third direction (the vertical direction VD). Referring to FIG. 26, the second input/output contact plug 403 may be apart from the second substrate 410 in a direction parallel to the upper surface of the second substrate 410, and may be connected to the second input/output pad 405 by penetrating an interlayer insulating layer 415 and the upper insulating layer 401 of the cell region CELL.

According to embodiments, the first input/output pad 305 and the second input/output pad 405 may be selectively formed. For example, the memory device 400 may include only the first input/output pad 305 on the first substrate 310, or may include only the second input/output pad 405 on the second substrate 410. Alternatively, the memory device 400 may include both the first input/output pad 305 and the second input/output pad 405.

In each of the outer pad bonding area PA and the bit line bonding area BLBA included in each of the cell region CELL and the periphery circuit region PERI, a metal pattern of the uppermost metal layer may exists as a dummy pattern, or the uppermost metal layer may be empty.

In the outer pad bonding area PA of the memory device 400, a lower metal pattern 373a having the same shape as an upper metal pattern 472a in the cell region CELL may be formed on the upper metal layer of the periphery circuit region PERI, in response to the upper metal pattern 472a formed on the upper metal layer of the cell region CELL. The lower metal pattern 373a formed on the uppermost metal layer of the periphery circuit region PERI may not be connected to a separate contact in the periphery circuit region PERI. Similarly to this case, in response to the lower metal pattern formed on the uppermost metal layer of the periphery circuit region PERI in the outer pad bonding area PA, an upper metal pattern having the same shape as the lower metal pattern of the periphery circuit region PERI may be formed on the upper metal layer of the cell region CELL.

The lower bonding metals 371b and 372b may be formed on the second metal layer 340b of the word line bonding area WLBA. In the word line bonding area WLBA, the lower bonding metals 371b and 372b of the periphery circuit region PERI may be electrically connected to the upper bonding metals 471b and 472b of the cell region CELL by using the bonding method.

In addition, in the bit line bonding area BLBA, in response to the lower metal pattern formed on the uppermost metal layer of the periphery circuit region PERI, an upper metal pattern 492 having the same shape as a lower metal pattern 352 of the periphery circuit region PERI may be formed on the upper metal layer of the cell region CELL. A contact may not be formed on the upper metal pattern 492 that is formed on the uppermost metal layer of the cell region CELL.

In an example embodiment, the memory device 500, such as described in FIG. 26, can operate and can include device components according to one or more of the example embodiments described in FIGS. 1 to 25 previously. In an example embodiment, the memory cell region CELL may correspond to the memory cell array 100 of FIG. 1 and the first semiconductor layer L1 of FIG. 2. In an example embodiment, the peripheral circuit region PERI may correspond to the periphery circuit 200 of FIG. 1 and the second semiconductor layer L2 of FIG. 2.

Figure 27:
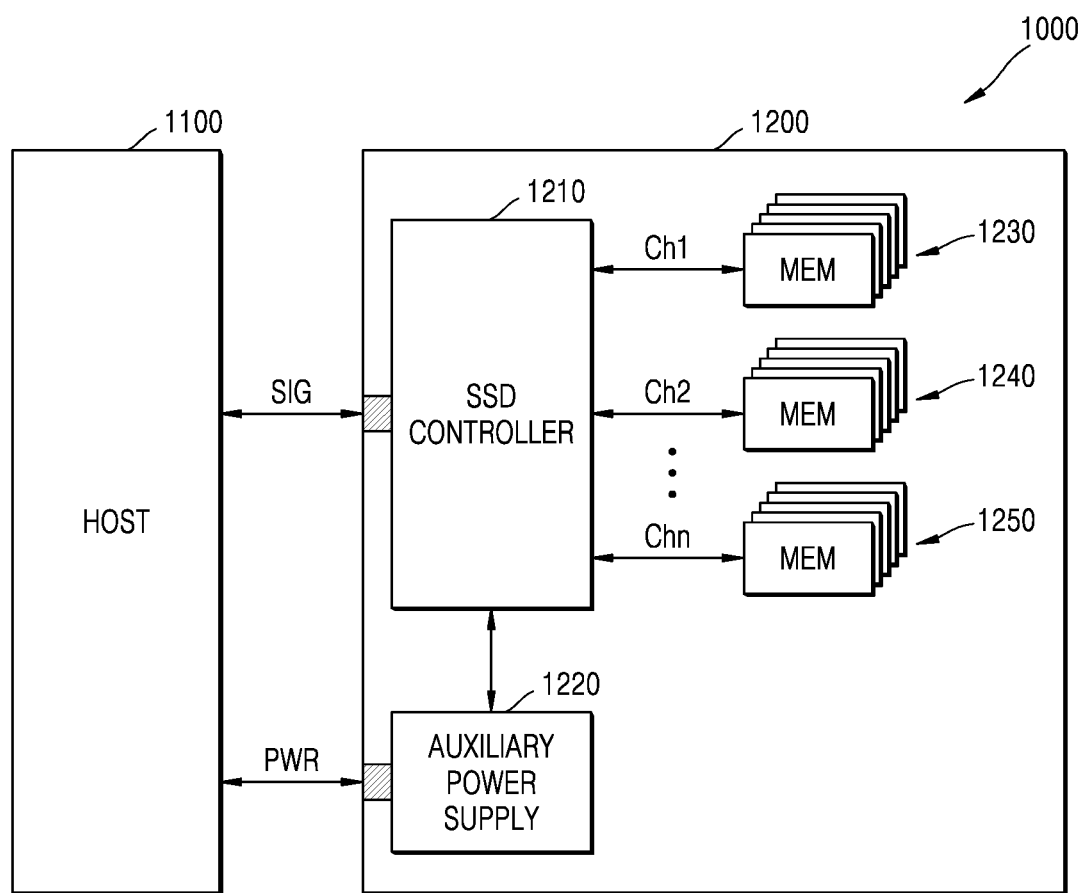
FIG. 27 is a block diagram of an example in which a memory device is applied to a solid state drive (SSD) system, according to embodiments of the inventive concept.

FIG. 27 is a block diagram of an example in which a memory device is applied to a solid state drive (SSD) system 1000, according to some embodiments of the inventive concept.

Referring to FIG. 27, the SSD system 1000 may include a host 1100 and an SSD 1200. The SSD 1200 may exchange signals with the host 1100 via a signal connector and receive a power via a power connector. The SSD 1200 may include an SSD controller 1210, an auxiliary power supply 1220, and memory devices 1230, 1240, and 1250. The memory devices 1230, 1240, and 1250 may include vertically stacked NAND flash memory devices. In this case, the memory devices 1230, 1240, and 1250 may be implemented by using the embodiments described above with reference to FIGS. 1 through 26.

While the inventive concept has been particularly shown and described with reference to embodiments thereof, it may be understood that various changes in form and details may be made therein without departing from the invention of the following claims.

What is claimed is:

1. A memory device comprising:
a memory cell area including a plurality of memory cells and a first metal pad; and
a periphery circuit area comprising a second metal pad, the periphery circuit area vertically connected to the memory cell area via the first metal pad and the second metal pad,
wherein the periphery circuit area further comprises a page buffer circuit comprising:
a plurality of page buffer units in a first horizontal direction, the plurality of page buffer units being connected to the memory cells via a plurality of bit lines; and
a plurality of cache latches in the first horizontal direction, the plurality of cache latches corresponding to each of the plurality of page buffer units and connected to a combined sensing node,
wherein each of the plurality of page buffer units comprises a pass transistor connected to a sensing node of each of the plurality of page buffer units, the sensing node electrically connected to a corresponding bit line, and
wherein the sensing nodes included in the plurality of page buffer units and the combined sensing node are electrically connected to each other through the pass transistors included in the plurality of page buffer units.

2. The memory device of claim 1, wherein each of the first metal pad and the second metal pad includes copper.

3. The memory device of claim 1, wherein the first metal pad and the second metal pad are connected to each other by using a bonding manner.

4. The memory device of claim 1, wherein the memory cell area is on a first wafer, and the periphery circuit area is on a second wafer.

5. The memory device of claim 1, wherein the plurality of bit lines include a plurality of first bit lines extending in the first horizontal direction and a plurality of second bit lines extending in the first horizontal direction,
wherein the plurality of memory cells include a plurality of first memory cells connected to each of the plurality of first bit lines and a plurality of second memory cells connected to each of the plurality of second bit lines, and wherein the periphery circuit area further comprises: a page buffer decoder adjacent to the page buffer circuit in the first horizontal direction, the page buffer decoder configured to generate a decoder output signal corresponding to a failed bit number from the plurality of first and second memory cells.

6. The memory device of claim 5, wherein the plurality of page buffer units includes:
a plurality of first page buffer units in the first horizontal direction, each connected to the plurality of first memory cells via the plurality of first bit lines; and
a plurality of second page buffer units in the first horizontal direction, each connected to the plurality of second memory cells via the plurality of second bit lines, and
wherein the plurality of cache latches includes:
a plurality of first cache latches in the first horizontal direction and corresponding to each of the plurality of first page buffer units; and
a plurality of second cache latches in the first horizontal direction and corresponding to each of the plurality of second page buffer units.

7. The memory device of claim 6, wherein the page buffer circuit includes:
a plurality of main regions in a second horizontal direction perpendicular to the first horizontal direction; and
a plurality of cache regions in the second horizontal direction,
wherein the plurality of main regions comprise:
a first main region including the plurality of first page buffer units each including one or more first pass transistors connected to a sensing node of each of the plurality of first page buffer units; and
a second main region adjacent to the first main region in the second horizontal direction, the second main region including the plurality of second page buffer units each including one or more second pass transistors connected to a sensing node of each of the plurality of second page buffer units,
wherein the plurality of cache regions comprise:
a first cache region including the plurality of first cache latches connected to a first combined sensing node; and
a second cache region adjacent to the first main region in the second horizontal direction, the second cache region including the plurality of second cache latches connected to a second combined sensing node,
wherein each sensing node of each of the plurality of first page buffer units and the first combined sensing node are electrically connected to each other through the first pass transistors, and
wherein each sensing node of each of the plurality of second page buffer units and the second combined sensing node are electrically connected to each other through the second pass transistors.

8. The memory device of claim 7, wherein the page buffer decoder is connected to:
the first combined sensing node such that each sensing node included in each of the plurality of first page buffer units and the page buffer decoder are electrically connected to each other through the first pass transistors, and
the second combined sensing node such that each sensing node included in each of the plurality of second page buffer units and the page buffer decoder are electrically connected to each other through the second pass transistors.

9. The memory device of claim 7, wherein the page buffer decoder comprises:
a first page buffer decoder connected to the plurality of first page buffer units via the first combined sensing node, the first page buffer decoder configured to provide a first signal corresponding to a voltage level of the first combined sensing node to a wired OR terminal; and
a second page buffer decoder connected to the plurality of second page buffer units via the second combined sensing node, the second page buffer decoder configured to provide a second signal corresponding to a voltage level of the second combined sensing node to the wired OR terminal,
wherein the first signal and the second signal are accumulated as the decoder output signal at the wired OR terminal.

10. The memory device of claim 7, wherein the periphery circuit area further comprises:
a mass bit counter configured to generate a counting result corresponding to the failed bit number from the decoder output signal.

11. The memory device of claim 1, wherein the plurality of cache latches are commonly connected to the plurality of page buffer units via the combined sensing node,
wherein each of the plurality of page buffer units comprises a pair of pass transistors, and
wherein each sensing node line included in each of the plurality of page buffer units and the combined sensing node are electrically connected to each other such that the plurality of page buffer units are electrically connected to the plurality of cache latches.

12. The memory device of claim 11, wherein the page buffer circuit is configured to sequentially perform data transfer operations between the plurality of page buffer units and the plurality of cache latches.

13. The memory device of claim 11, wherein the plurality of page buffer units are in a line in the first horizontal direction,
wherein the plurality of cache latches are in a line in the first horizontal direction, and
wherein the sensing node lines included in the plurality of page buffer units extend in the first horizontal direction.

14. A memory device comprising:
a memory cell array including a plurality of first memory cells connected to each of a plurality of first bit lines extending in a first horizontal direction and a plurality of second memory cells connected to each of a plurality of second bit lines extending in the first horizontal direction;
a page buffer circuit including a plurality of main regions in a second horizontal direction perpendicular to the first horizontal direction, and a plurality of cache regions in the second horizontal direction; and
a page buffer decoder adjacent to the page buffer circuit in the first horizontal direction, the page buffer decoder configured to generate a decoder output signal corresponding to a failed bit number from the plurality of first and second memory cells,
wherein the memory cell array is on a first wafer, and the page buffer circuit and the page buffer decoder are on a second wafer,
wherein the plurality of main regions comprise:
a first main region including a plurality of first page buffer units in the first horizontal direction, each connected to the plurality of first memory cells via the plurality of first bit lines, each including one or more first pass transistors connected to a sensing node of each of the plurality of first page buffer units; and a second main region adjacent to the first main region in the second horizontal direction, the second main region including a plurality of second page buffer units in the first horizontal direction, each connected to the plurality of second memory cells via the plurality of second bit lines, each including one or more second pass transistors connected to a sensing node of each of the plurality of second page buffer units, wherein the plurality of cache regions comprise:

a first cache region including a plurality of first cache latches in the first horizontal direction and corresponding to each of the plurality of first page buffer units, the plurality of first cache latches connected to a first combined sensing node; and a second cache region adjacent to the first main region in the second horizontal direction, the second cache region including a plurality of second cache latches in the first horizontal direction and corresponding to each of the plurality of second page buffer units, the plurality of second cache latches connected to a second combined sensing node, wherein each sensing node of each of the plurality of first page buffer units and the first combined sensing node are electrically connected to each other through the first pass transistors, and wherein each sensing node of each of the plurality of second page buffer units and the second combined sensing node are electrically connected to each other through the second pass transistors.

15. The memory device of claim 14, wherein the page buffer decoder is connected to:

the first combined sensing node such that each sensing node included in each of the plurality of first page buffer units and the page buffer decoder are electrically connected to each other through the first pass transistors, and the second combined sensing node such that each sensing node included in each of the plurality of second page buffer units and the page buffer decoder are electrically connected to each other through the second pass transistors.

16. The memory device of claim 14, wherein the page buffer decoder comprises:

a first page buffer decoder connected to the plurality of first page buffer units via the first combined sensing node, the first page buffer decoder configured to provide a first signal corresponding to a voltage level of the first combined sensing node to a wired OR terminal; and a second page buffer decoder connected to the plurality of second page buffer units via the second combined sensing node, the second page buffer decoder configured to provide a second signal corresponding to a voltage level of the second combined sensing node to the wired OR terminal, wherein the first signal and the second signal are accumulated as the decoder output signal at the wired OR terminal.

17. The memory device of claim 14, further comprising:

a mass bit counter configured to generate a counting result corresponding to the failed bit number from the decoder output signal.

18. The memory device of claim 14, wherein each of the plurality of first page buffer units comprises a pair of first pass transistors, wherein each sensing node line included in each of the plurality of first page buffer units and the first combined sensing node are electrically connected to each other such that the plurality of first page buffer units are electrically connected to the plurality of first cache latches, wherein each of the plurality of second page buffer units comprises a pair of second pass transistors, and wherein each sensing node line included in each of the plurality of second page buffer units and the second combined sensing node are electrically connected to each other such that the plurality of second page buffer units are electrically connected to the plurality of second cache latches.

19. The memory device of claim 18, wherein the page buffer circuit is configured to sequentially perform data transfer operations between the plurality of first and second page buffer units and the plurality of first and second cache latches.

20. The memory device of claim 18, wherein the plurality of first and second page buffer units are in a line in the first horizontal direction, wherein the plurality of first and second cache latches are in a line in the first horizontal direction, and wherein the sensing node lines included in the plurality of first and second page buffer units extend in the first horizontal direction.

* * * * *